United States Patent [19]

Larson

[11] 3,879,618

[45] Apr. 22, 1975

[54] TOUCH SENSITIVE ELECTRONIC SWITCH

[75] Inventor: Willis A. Larson, Wayzata, Minn.

[73] Assignee: Magic Dot, Inc., Minneapolis, Minn.

[22] Filed: Oct. 13, 1972

[21] Appl. No.: 297,410

Related U.S. Application Data

[63] Continuation of Ser. No. 199,195, Nov. 16, 1971, abandoned.

[52] U.S. Cl. .......... 307/116; 200/DIG. 1; 340/365 R

[51] Int. Cl. .......... H01h 35/00

[58] Field of Search ....... 307/116, 118; 200/DIG. 1, 200/DIG. 2, 52 R; 317/DIG. 2, DIG. 1; 340/365 R, 365 C; 328/5

[56] References Cited

UNITED STATES PATENTS

| | | | |
|---|---|---|---|
| 3,144,592 | 8/1964 | Leeds et al. | 317/148.5 B |
| 3,629,665 | 12/1971 | Hoste | 307/116 |
| 3,766,404 | 10/1973 | Larson et al. | 307/116 |
| 3,787,732 | 1/1974 | Larson | 307/116 |
| 3,805,086 | 4/1974 | Larson et al. | 307/116 |

*Primary Examiner*—Robert K. Schaefer
*Assistant Examiner*—William J. Smith
*Attorney, Agent, or Firm*—Wicks & Nemer

[57] ABSTRACT

A touch sensitive electronic switch which has no moving parts and is actuated by the skin resistance of an operator causing a lowering of D.C. resistance across the face of the switch is disclosed. The electronic switch, in the preferred embodiment shown, includes three electrodes laterally spaced and arranged with respect to each other upon an insulator. The second electrode is laterally spaced and insulated from the first electrode and arranged around and about the first electrode with the level of the top surface of the second electrode rising above the level of the top surface of the first electrode. The third electrode is laterally spaced and insulated from both the first and second electrodes to provide a conductive electrical shielding electrode between the first and second electrodes. The first and second electrodes are exposed to the finger of an operator upon the top surface of the insulator in a manner that the operator's finger bridging between the first and second electrodes allows a direct current path to be set up laterally between the first electrode and the second electrode to thereby provide an activation of the switch through a lowering of the D.C. resistance across the face of the switch. When the operator's finger is removed, the shielding effect of the third electrode prevents any leakage currents from flowing between the first electrode and the second electrode from establishing such a direct current path. Electronics for use with such an electronic switch and various configurations and relationships of such an electronic switch are further disclosed.

66 Claims, 21 Drawing Figures

INVENTOR.
BY Willis A. Larson
Wicks & Nemer

INVENTOR.
Willis A. Larson
BY
Wicks & Nemer

INVENTOR.
Willis A. Larson
BY
Wicks & Nemer

INVENTOR.
Willis A. Larson
BY
Wicks & Nemer

INVENTOR.
Willis A. Larson
BY
Wicks & Nemer
ATTORNEYS

TOUCH SENSITIVE ELECTRONIC SWITCH

CROSS REFERENCES

This is a continuation of an application for Letters Pat., Ser. No. 199,195, filed Nov. 16, 1971, now abandoned.

This invention is further an improvement upon the subject matter disclosed and claimed in application for Letters Patent filed in the name of Willis A. Larson, now U.S. Pat. No. 3,737,670, entitled "Touch Sensitive Electronic Switch" (hereinafter referred to as the "original application"). The present application is further a companion application to applications for Letters Patent by: Willis A. Larson and Raymond M. Warner, Jr., now U.S. Pat. No. 3,766,404, entitled "Composite D.C. Amplifier For Use With A Touch Sensitive Electronic Switch"; Willis A. Larson, now U.S. Pat. No. 3,715,540, entitled "Touch Sensitive Electronic Switch"; Willis A. Larson and Stephen R. Tell, now U.S. Pat. No. 3,728,501, entitled "Touch Sensitive Electronic Switch"; and Willis A. Larson and Arthur Kimmel, now U.S. Pat. No. 3,805,086, entitled "Touch Sensitive Electronic Switch".

BACKGROUND

This invention relates generally to electronic switching and more specifically to a touch sensitive electronic switch which has no moving parts and is actuated by the skin resistance of an operator lowering the D.C. resistance across the face of the switch.

In the above referred to original application by Willis A. Larson, the problem of avoiding a sufficiently conductive path across the switch face due to surface contamination such that an undesired activation will occur was indicated as preventable by providing inaccessible vertical portions to thereby avoid contact with the fingers. Thus, the original application taught long leakage paths in an attempt to minimize or prevent contamination from providing the undesired activation.

The present invention offers another solution which eliminates the problem of undesired activation due to current leakage between the operative electrodes of the electronic switch due to face contamination.

Another application which deals with current leakage between the operative electrodes of a touch sensitive electronic switch is the companion application for patent filed of even date herewith by Willis A. Larson and Arthur Kimmell, identified above.

It has been found that conventional amplifiers are not completely satisfactory for use with touch sensitive electronic switches which are actuated by skin resistance. It has further been found that an amplifier which is satisfactory for use with such touch sensitive switches in a large variety of applications and under a variety of operating conditions should have: direct current coupled stages: high gain, low voltage across its output in the ON condition; low output current in the OFF condition; a low current threshold at the input; and a low voltage offset at the input.

The present invention, after defining and deriving the above advantages, provides an electronic circuit with these advantages.

The electronic circuit disclosed herein is claimed in the above identified application for patent filed of even date herewith by Willis A. Larson and Raymond M. Warner, Jr.

Also, in the above referred to original application by Willis A. Larson, the advantage in a touch sensitive electronic switch of the operator's finger first making contact with an electrode arranged to be connected to the voltage supply terminal of a D.C. amplifier before contact is made with an electrode arranged to be connected to the input of a D.C. amplifier was disclosed. As was stated, this arrangement allows good contact of the operator's finger with the supply connected electrode before contact is made with the input connected electrode and thereby allows the harmless grounding of the usual alternating voltage induced from an external source into the operator's body.

Variance of the touch threshold of such a switch was further disclosed in the above referred to original application by varying the depth of the input connected electrode with respect to the supply connected electrode. It was indicated that the deeper the input connected electrode was placed with respect to the supply connected electrode, the heavier the touch required to force the operator's fingertip into contact with both electrodes.

Thus, a design choice was necessary to provide a switch which would allow harmless grounding of the alternating voltage in an operator's body and yet not require a high degree of contact force before actuation of the switch is achieved. The present invention discloses a relationship which may be used to determine the minimum depth required to provide for reliable grounding of the voltage within an operator's body and yet minimize the touch threshold required to reliably actuate the switch.

Also, because of the relationship of the present invention, a touch sensitive electronic switch may now be designed with more specificity than heretobefore possible. Once the minimum depth to provide reliable grounding of the A.C. voltage within an operator's body is known, the actual depth for which the switch is designed may be varied from the minimum depth to thus vary the touch threshold of the switch.

Also, the present invention discloses additional relationships and configurations for a touch sensitive electronic switch which may further be used to achieve switches of low cost, with high reliabiltiy, and amenable to rapid and uniform fabrication including mass production techniques. Further, the relationships and configurations of the present invention provide touch sensitive electronic switches which are reliable, insensitive to the precise placement of the operator's finger upon the switch face as to both manner and location, and insensitive to the precise dimensioning of the finger of the operator.

SUMMARY

In summary a preferred embodiment of the present invention includes a first electrode immovably arranged upon an insulator and a second electrode also immovably arranged upon an insulator. The second electrode is further arranged around and about and laterally spaced and insulated from the first electrode. A third electrode is also immovably arranged upon an insulator in a spaced and insulated relationship with both the first and second electrodes and laterally between them. The first and second electrodes are exposed to the finger of an operator upon the top surface of the insulating media in a manner that the operator's finger bridging between the second electrode and the first electrode allows a direct current path to be set up laterally between the second and the first electrodes to thereby provide an actuation of the switch through a lowering of the D.C. resistance across the face of the switch. When the operator's finger is removed, the shielding effect of the interposed third electrode prevents any leakage currents from flowing between the second electrode and the first electrode and establishing such a direct current path.

Also in the preferred embodiment of the touch sensitive electronic switches of the present invention, the vertical distance between the level of the top surface of the second electrode and the level of the top surface of the first electrode, which is also termed the height differential between the electrodes, and the lateral distance or spacing between the electrodes, and the dimensions of an operator's finger have been found to be interrelated in a fashion which allows a switch design minimizing the touch sensitivity or threshold of the switch and yet insuring a height differential between the electrodes which will allow grounding of the alternating voltage in an operator's body by the second electrode before a direct current path is set up between the second electrode and the first electrode.

A preferred embodiment of the electronic circuit of the present invention comprises a composite of three amplifiers, with one amplifier having two amplifying stages. A first amplifier in the preferred embodiment, is a PNP transistor receiving a D.C. input signal from the lowering of the D.C. resistance across a skin resistance actuated electronic switch. The input signal, a current in the nanoampere range, is conducted through a current limiting base resistor and input buffer amplifier to the PNP transistor which in turn, provides an amplified current to a Darlington type amplifier to two NPN transistors. The Darlington type amplifier also in turn provides an amplified D.C. signal to an NPN output transistor which saturates and thus appears as an electronic switch in the closed or ON condition.

Various resistors in the composite amplifier provide for the limiting of current, provide for the dampening of any oscillations, and provide shunting paths for leakage current in the OFF condition to thus provide the advantages discussed above.

It is thus a broad object of the present invention to provide a novel touch sensitive electronic switch.

It is a further object of the present invention to provide such a switch having extremely low leakage currents between electrodes to thus maintain the integrity of the switch in the OFF condition.

It is as further object of the present invention to provide such a switch where an electrode acts as a shield to prevent a flow of leakage current between other electrodes.

It is a further object of the present invention to provide such a switch which may be designed with more specificity than heretobefore possible.

It is a further object of the present invention to provide such a switch wherein the spacing and height differential between electrodes can be more precisely specified to insure a grounding of any voltage or current from an operator's body and yet provide a minimum or near minimum touch sensitivity, if desired.

It is a further object of the present invention to provide such a switch wherein the height differential between electrodes may be varied to thereby vary the touch threshold or touch sensitivity, if desired.

It is a further object of the present invention to provide such a switch wherein the effect of placement of the operator's finger upon the switch face is reduced or eliminated.

It is a further object of the present invention to provide such a switch wherein the effect of variance in the dimensioning of an operator's finger is reduced or eliminated.

It is a further object of the present invention to provide a composite D.C. amplifier for use in conjunction with such a switch in a large variety of applications and under a variety of conditions.

These and further objects and advantages of the prevent invention will become clearer in light of the following detailed description of illustrative embodiments of this invention described in connection with the drawings.

Figure 1:
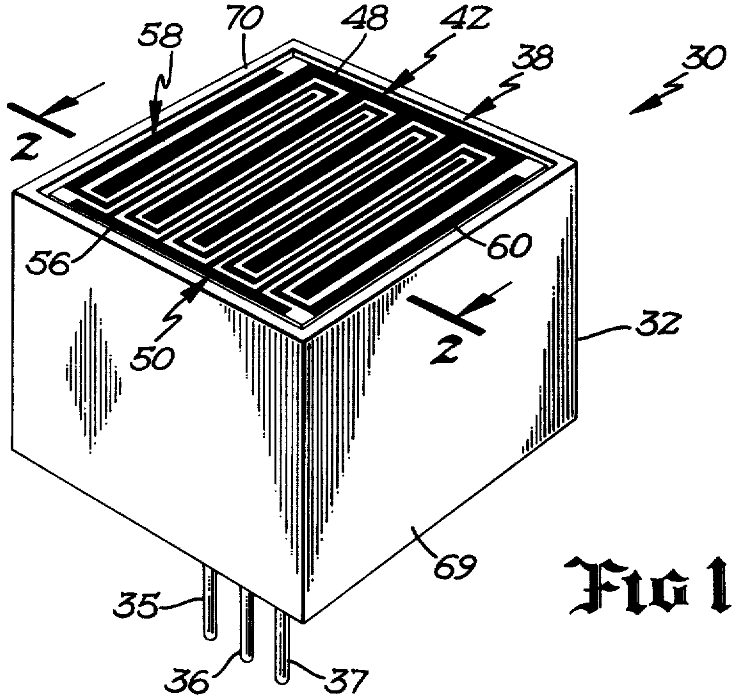
FIG. 1 shows a perspective view of a preferred embodiment of a touch sensitive electronic switch according to the present invention.

Where used in various figures of the drawings, the same numerals designate the same or similar parts. Furthermore, when the terms "right", "left", "front", "back", "vertical", "horizontal", "right edge", "left edge", "left rear", and similar terms are used herein, it should be understood that these terms have reference only to structures shown in the drawings as it would appear to a person viewing the drawings, and are utilized only to facilitate describing the present invention.

DESCRIPTION

Figure 2:
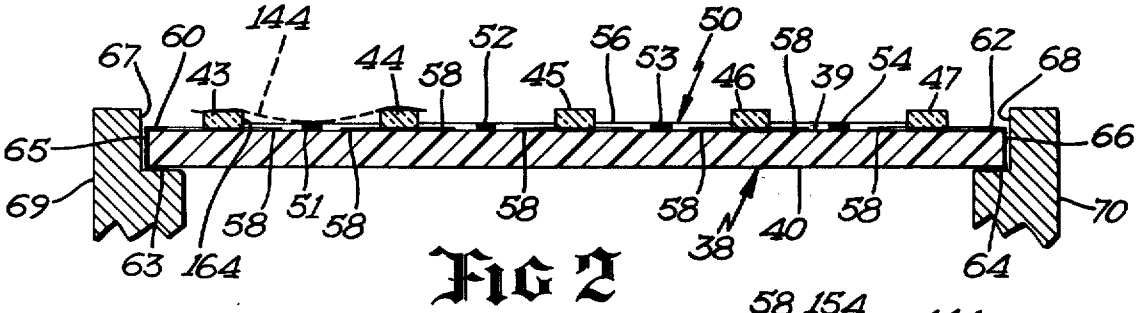
FIG. 2 shows a partial, enlarged, cross sectional view of a touch sensitive electronic switch according to section lines 2—2 in FIG. 1.

In FIGS. 1 and 2, a touch sensitive electronic switch, generally designated 30, is shown. Switch 30 includes a plastic housing 32 incorporating holes (not shown) for three pins, 35, 36, and 37 which allow connection to the switch 30. Switch 30 also includes another hole (not shown) for allowing the filling of the inside of housing 32 with an encapsulating compound.

Switch 30 includes a square of an insulating media or insulating material in the form of a ceramic slice 38 having a flat or planar top surface or face 39 and bottom surface or face 40.

Ceramic 38 supports supply conductor or electrode 42 including a digitated array of five fingers 43, 44, 45, 46, and 47 which extend across the top face or switch face 39 of ceramic 38 from back to front. A conductive trace 48 positioned at the back edge of switch face 39 perpendicularly to the supply fingers interconnects the supply fingers to form supply electrode 42.

Ceramic 38 also supports an input conductor or electrode 50 which includes a digitated array of four fingers 51, 52, 53, and 54 which extend across the switch face 39 from front to back. Input fingers 51–54 are arranged around and about and laterally spaced and insulated from supply fingers 43–47, and in particular are arranged with one input finger between each two supply fingers. A conductive trace 56 arranged on the front edge of switch face 39 perpendicularly to the input fingers to form input electrode 50.

Thus, supply electrode 42 and input electrode 50 take the form of arrays of interlaced or interdigitated components including fingers extending from an edge of the switch face 39 towards one another.

Ceramic 38 also supports a reference, common, or ground conductor or electrode 58. Ground 58 is arranged in serpentine fashion around supply fingers 43–47, between the interdigitated arrangement of supply fingers 43–47 and input fingers 51–54, and laterally spaced and insulated from both sets of fingers. That is, starting at the left edge of ceramic 38 as shown in FIG. 2, with conductive trace 60 forming a portion of ground electrode 58, electrode 58 extends towards the front edge of switch 30 around the end of supply finger 43, and towards the back edge of switch face 39 around the end of input finger 51, towards the front edge of switch face 39 around the end of supply finger 44, again towards the back edge of switch face 39, and from there around input finger 52, supply finger 45, input finger 53, supply finger 46, input finger 54, supply finger 47 to the right edge of switch face 39, as shown in FIG. 2, to terminate in conductive trace 62.

In fabricating the preferred embodiment of electronic switch 30, a metallic paste is screened onto the top surface 39 of ceramic 38 in the pattern of all electrodes, 42, 50, and 58, and the paste is dried. After the paste on the top surface 39 of ceramic 38 is dried, a metalization configuration for the electronic circuitry to which a face will be connected is similarly screened and dried on the bottom side 40 of ceramic 38. This screening includes conductive traces 63 and 64 which will be connected to conductive traces 60 and 62 of ground electrode 58, in a manner hereinafter explained, and further includes other traces, not shown, which will be similarly connected to supply conductive trace 48 and input conductive trace 56.

Next, preparation is made to fabricate the wrap around connections from the top side 39 of ceramic 38 to the bottom side 40 of ceramic 38 between conductive traces 60 and 63 and between traces 62 and 64 of ground electrode 58, and for the wrap around connections from conductive trace 48 of supply electrode 42, and for the wrap around connection from conductive trace 56 of input electrode 50. In the preferred embodiment, all four edges of ceramic 38 are edgecoated as by painting, brushing, or other means of application to form the conductive interconnections between the top and bottom traces. For example, interconnection 65 is formed between trace 60 forming a part of ground electrode 58 on the top surface 39 of ceramic 38 and conductor 63 on the bottom surface 40. Trace 62 is connected to trace 64 in a similar manner. If desired, the wrap around interconnection may be made by edge-dipping of the ceramic 38.

Thus, all wrap around interconnections are made, including the two sides for the ground connected electrode 58 to eliminate any leakage from the supply electrode to the input electrode around the edges of the ceramic, a consideration which will be discussed further hereinafter. After all wrap around connections are dried, all conductors are fired to complete the initial conductor fabrication.

Next, any screened resistors needed are printed on the back side 40 of ceramic 38, dried, and fired. The entire ceramic 38 is then subjected to a conventional stabilization bake. It is also preferred that the top surface 39 of ceramic 38 be glazed to prevent contaminants from penetrating into the ceramic.

Thus, all conductors are fabricated including the interdigitated array of supply electrodes 42 and input electrodes 50. Because a screening process is used which simultaneously screens all the electrodes of a given type, each array of electrodes presents a top surface to the finger of an operator which is substantially on the same level. That is, by simultaneously screening all components of the supply electrode 42, supply electrode 42 may be said to have a top surface which is the top surface of each of its components, 43–47 and 48. Supply electrode 42 then may be said to rise from ceramic 38 to present a top surface to the finger of an operator. Similarly, the components 51–54 and 56 of the input electrode 50 may be said to rise from ceramic 38 to also present a top surface to the finger of the operator. It is to be noted that the level of the top surface of supply electrode 42 is shown as above the level of the top surface of the input electrode 50 for purposes hereinafter explained. It is also to be noted that the level of the top surfaces of the reference electrode 58 is below the level of the top surface of input electrode 50 and the level of the top surface of supply electrode 42, for supposes hereinafter explained.

If the composite amplifier to be used with electronic switch 30 is the preferred monolithic integrated chip, the chip is at this time bonded to the prefabricated metalization on the bottom 40 of ceramic 38 in a conventional manner. If concrete transistors are to be used, individual chips comprising such discrete transistors are also conventionally bonded to the prefabricataed metal and the deposited resistors prefabricated on the bottom 40 of ceramic 38. As is obvious, discrete components could also be used and mounted in the space within housing 32.

All wire bonding is done at this time, as between the metalization and the monolithic integrated chip or the metalization and individual chips comprising discrete transistors. A varnish or elastic coating is then applied to bottom side 40 of ceramic 38 to protect the circuit and the wire bonding while the output pins 35, 36, and 37 are connected to ceramic 38 and by prefabricated metalization to the circuitry either within housing 32 or on the bottom side 40 of ceramic 38.

Ceramic 38 is then arranged with the notches 67 and 68 cut into opposite side walls 69 and 70 of housing 32 and similarly within notches, not shown, cut into the front and back walls of housing 32 with pins 35, 36, and 37 connected to the electronic circuitry. Testing of the switches and their associated electronic circuits occurs, and a filling material is added to all remaining space within the housing 32 through a hole, not shown.

Next, additional height of input electrode 42 and supply electrode 50 is achieved by using solder clad preforms in the shape of the respective electrodes. The preforms are set in place over the previously screened configuration of electrodes 42 and 50, the face 39 of ceramic 38 is subjected to heating, and the solder backed preforms are thus soldered to the previously screened base portions of electrodes 42 and 50. It is to be noticed that because of surface tension, the preforms are self aligning.

Finally, the electronic switches and their associated circuitry are tested and sorted by electrical parameters.

Figure 3:
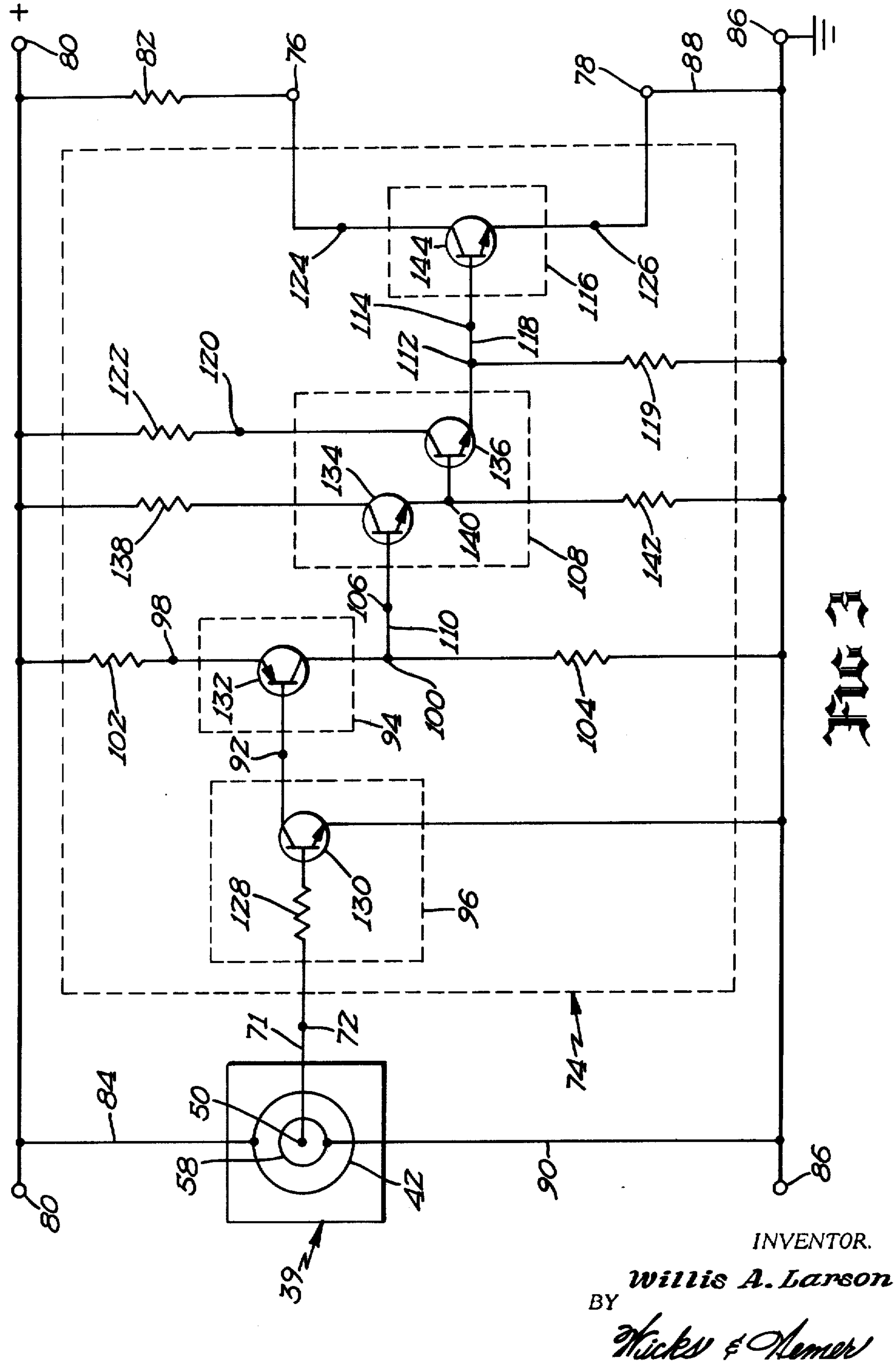
FIG. 3 shows a schematic representation of a preferred embodiment of electronic circuitry of the present invention arranged for integrated circuit fabrication.

In FIG. 3, switch face 39 is shown in schematic form with supply electrode 42, input electrode 50, and ground electrode 58 also schematically represented.

Input electrode 50 is connected by a lead 71 to input 72 of a composite amplifier, generally designated 74, including outputs 76 and 78. Output 76 is connected to a first terminal 80 of a D.C. voltage source or supply through resistor 82 representing an electrical load. Supply terminal 80 is also connected to a supply electrode 42 through a lead 84. Output 78 is connected to a second supply terminal 86 of the D.C. voltage suply through a connection 88. Terminal 86 is further connected to ground electrode 58 by a connection 90. The D.C. voltage source, not specifically shown, includes the first and second terminals 80 and 86, and provides direct current to amplifier 74. As shown in the preferred embodiment of FIG. 3, terminal 86 is aa common, ground, or reference terminal, and terminal 80 is of a positive D.C. voltage differing from the voltage at 86.

Input 72 to composite amplifier 74 is connected to input 92 of a first amplifier 94 through a buffer amplifier 96. First amplifier 94 further includes two outputs in the form of junction points 98 and 100. A current limiting resistor 102 is connected between junction point 98 and supply terminal 80, and a leakage prevention resistor 104 is connected between junction point 100 and supply terminal 86. Junction point 100 is further connected to an input junction point 106 of a second amplifier 108 through a lead 110. Second amplifier 108 includes an output junction point 112 connected to an input junction point 114 of a third amplifier 116 by a lead 118 and to supply terminal 86 by another leakage prevention resistor 119. Second amplifier 108 further includes output junction point 120 connected to supply terminal 80 by a current limiting and parasitic oscillation reducing resistor 122. Third amplifier 116 includes an output junction point 124 connected to output 76 of amplifier 74 and an output junction point 126 connected to output 78 of amplifier 74.

Buffer amplifier 96 includes a base current limiting resistor 128 connected between input 72 and the base of an NPN transistor 130. Transistor 130 has its emitter connected to supply terminal 86 and its collector connected to input junction point 92 of first amplifier 94.

First amplifier 94 includes PNP transistor 132 having its base connected to junction point 92, its emitter connected to junction point 98, and its collector connected to junction point 100.

Second amplifier 108 includes two amplifying stages in the form of NPN transistors 134 and 136 connected in a Darlington type arrangement. First Darlington transistor 134 has a base connected to junction point 106, a collector connected to supply terminal 80 through another current limiting and oscillation reducing resistor 138. The emitter of transistor 134 provides an output current to the base of the second Darlington transistor 136 through junction point 140. Second Darlington transistor 136 has its emitter connected to junction point 112, and its collector connected to junction point 120.

A leakage prevention resistor 142 is connected between junction point 140 and supply terminal 86.

Third amplifier 116 includes NPN transistor 144 with its base connected to junction point 114, its collector connected to junction point 124, and its emitter connected to junction point 126.

Figure 4:
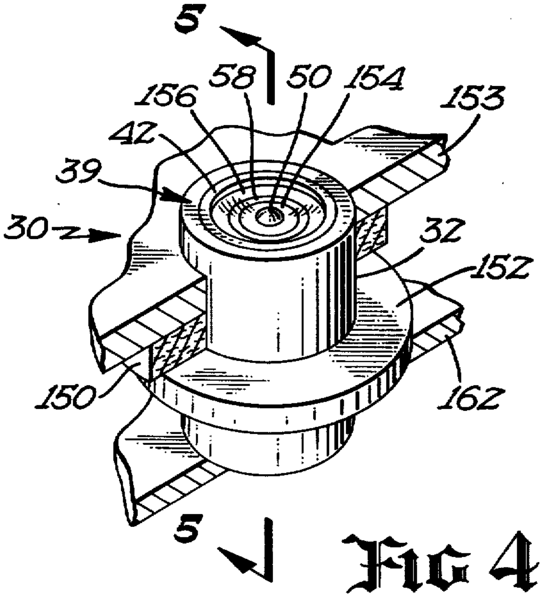
FIG. 4 shows a perspective view of another embodiment of a touch sensitive electronic switch according to the present invention.
Figure 5:
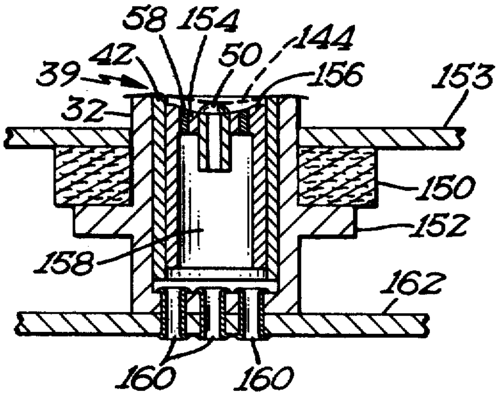
FIG. 5 shows a cross sectional view of a touch sensitive electronic switch according to section lines 5—5 in FIG. 4.

In FIGS. 4 and 5, a switch 30 is shown as including a housing 32, which may be made of any suitable durable insulating material, and a switch face 39, Switch 30 is shown as it would be utilized with a printed wire borad. A dust seal 150 of foam rubber or the like is placed between a flange 152 of housing 32 and a panel 153 through which the housing extends for manual access.

As best shown in FIG. 4, the electronic switch electrodes comprise an input, first or center electrode 50, a supply, second, or annular electrode 42, and a reference, third, or ground electrode 58. Center electrode 50, annular electrode 42, and ground electrode 58 are separated, insulated, and held in their respective positions by insulating rings 154 and 156 in a manner that insulating ring 154 separates electrodes 50 and 58, and insulating ring 156 separates electrodes 58 and 42. It will be observed in FIG. 5 that the insulating rings 154 and 156 take the form of hollow cylinders to provide a chamber 158 into which the electronic components of a high gain D.C. amplifier may be placed, as set out herein. Three hollow conductors 160 are imbedded in the bottom portion of housing 32 to provide communication to chamber 158. The hollow conductors permit leads to be brought from the chamber 158 to the lower surface of a printed wiring board 162 where they may be soldered into place in the usual manner. The solder will also adhere to the hollow conductors 160 to provide a certain degree of mechanical strength in attaching the electronic switch to the printed wire board 162.

The particular arrangement of the three electrodes 42, 50, and 58 of the electronic switch 30 of the present invention as shown in FIGS. 4 and 5 may now be explained. Center electrode 50 is immovably arranged with the insulating ring 154, with a top surface of electrode 50 exposed to the finger of an operator upon the top surface of insulating ring 154. Annular electrode 42 is also immovably arranged with the insulating material of housing 32 and the insulating ring 156, and with electrode 50, and is arranged laterally around and about and insulated from electrode 50 in a manner to expose the top surface of the annular electrode 42 to the finger of the operator upon the top surface of its surrounding insulating material. The level of the top surface of the annular electrode 42 is further arranged above the level of the top surface of the center electrode 50 in a manner that the finger of the operator touches the second electrode 42 before contact is made between the finger and the center electrode 50 to thereby allow good contact of the operator's finger with the annular electrode 42 before contact is made with the center electrode 50 and thereby allow the harmless grounding of the usual alternating voltage induced from an external source into an operator's body. This arrangement of electrodes also allows a direct current path to be set up laterally between the center electrode 50 and the annular electrode 42 as soon as the finger of the operator touches the center electrode 50.

Ground electrode 58 is also immovably arranged with its surrounding insulating media, insulating rings 154 and 156, and with the center and annular electrodes. Ground electrode 58 is further arranged laterally between the center and annular electrodes and around the center electrode and is insulated from both electrodes as a conductive electrical shield electrode allowing leakage current which could otherwise flow between the center electrode and the annular electrode to be conducted to a reference point through the ground electrode 58 to thus aid in preventing the flow of leakage current between center electrode 50 and annular electrode 42 which would otherwise tend to set up a nonactuated direct current path from the center electrode to the annular electrode. Thus, a nonactuated direct current path between the first and second electrodes is one such as may be caused by leakage current in the switch and not be a touching of the switch face by the operator's finger or other external cause.

In FIGS. 6, 7, 8, 9, and 10 schematic representations of various types of configuration switch face 39 can take and yet operate according to the present invention are shown. Section lines 2'—2' and 2''—2'' in FIGS. 6–10 indicate the sections of each switch face 39 which would appear basically as the section shown in FIG. 2. Differences, if any, would be in the representative number of parts of the various electrodes and the dimensioning of and between the various electrodes.

Figure 6:
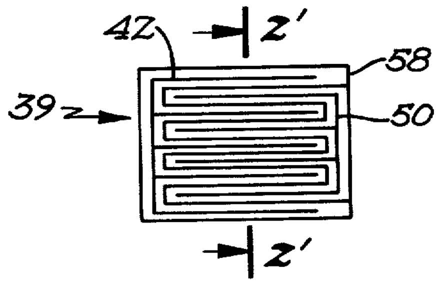
FIGS. 6–11 show top schematic and perspective views of additional face configurations of the touch sensitive switch shown in FIG. 1.

Each array shown in FIG. 6–10 conforms to the basic requirements of a preferred face configuration according to the present invention. That is:

1. The arrangement of electrodes is such that an operator touches the supply electrode 42 before input electrode 50 is touched;
2. There is no practical, contaminable leakage path between any portion of supply electrode 42 and input electrode 50 that is not interrupted by a portion of ground electrode 58; and
3. Each switch face includes a laterally repetitive arrangement of supply electrodes 42, input electrodes 50, and ground electrodes 58, such as illustrated in the cross sectional view of FIG. 2. In FIG. 6, an example of an open repetitive array of the interdigitated type is shown including input electrode 50 and supply electrode 42 arranged around and about input electrode 50. Input electrode 50 includes 4 fingers and supply electrode 42 includes 5 fingers interdigitated with each other as shown. Ground electrode 58 is arranged in a serpentine fashion between the interdigitated fingers of supply electrode 42 and input electrode 50 and completely around the interdigitated arrangement. Thus, the arrangement of ground electrode 58 is a general case where there is no practical, contaminable leakage path between any portion of supsply electrode 42 and input electrode 50 that is not interrupted by an interposed portion of ground electrode 58. The arrangement of ground electrode 58 of FIG. 1 is a less general case where ground electrode 58 is not positioned adjacent to conductive trace 48 of supply electrode 42 and ground electrode 58 is not positioned adjacent to conductive trace 56 of input electrode 50. Thus, input electrode 42 and supply electrode 50 in the configuration of FIG. 1 have access to the edge of ceramic 38 to allow ease of connection to these electrodes by edge-coating of ceramic 38, as discussed above. The configuration of FIG. 1 is then termed an open ended open array.

The arrangement of FIG. 1 without a ground electrode 58 completely encircling the interdigitated arrangement 58 completely encircling the interdigitated arrangement of supply and input electrodes 42, and 50, also conforms to the requirements that ground electrodes 58 must be interposed to prevent leakage in that ground electrode 58 is carried around the edge of ceramic 38, as by conductive traces 60, 65, and 63 and by conductive traces 62, 66, and 64. Ground electrode 58 thereby can extend across the bottom face 40 of ceramic 38 to yet be interposed between supply electrode 42 and input electrode 50. Also, ground electrode 58 need not extend completely across the bottom face 40 of ceramics 38 if a high resistance, nonconductive path can be maintained between supply and input electrodes 42 and 50. That is, conductive traces 63 and 64 can extend towards one another without being connected if,-for example, the bottom face 40 of ceramic 38 includes at least a portion of conductors 63 and 64 sealed as by encapsulation to maintain a high resistance path where there is a break in ground electrode 58. Thus, if portions of conductive traces 63 and 64 are beneath a protective coating, ground electrode 58 is yet interposed between each portion of supply electrode 42 and input electrode 50 where a practical contaminable path exists. Where no practical, contaminable path exists, as in the area sealed on the bottom 40 of ceramic 38, there may be a break in ground electrode 58 and yet prevent any practical, contaminable leakage path between supply and input electrodes 42 and 50.

Figure 7:
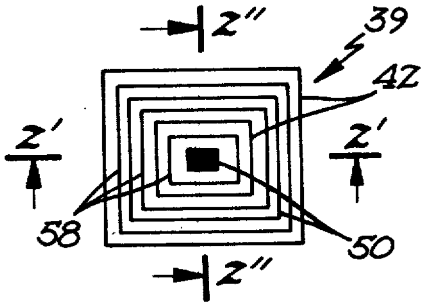

In FIG. 7, an example of a closed repetitive array according to the present invention is shown including supply electrode 42, input electrode 50, and an interposed ground electrode 58. The closed repetitive array of FIG. 7 is shown as successively smaller enclosed rectangles, but may as well be other closed geometric figures, such as circles, squares, triangles or the like.

Th closed repetitive array of FIG. 7 includes supply electrode 42 as its outermost electrode, but may also have input electrode 50 as the outermost electrode if a corollary of the requirements of the preferred face configuration of the present invention is followed. That is, with a mechanically shielded edge to switch face 39, any type of electrode, a supply electrode, an input electrode, or a ground electrode, may be used to start an array. With a mechanically unshielded edge, the preferred array should start with a supply electrode 42 to thereby allow the operator's finger to first touch a supply electrode 42 and allow harmless grounding of the A.C. voltage induced from an external source into the operator's body. An example of such mechanical shielding is shown in FIG. 2 where the outermost electrode is ground electrode 58 and this electrode is mechanically shielded by sidewalls 69 and 70.

Figure 8:
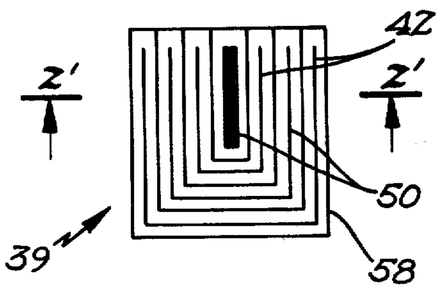

In FIG. 8, an example of an open repetitive array is shown including supply electrodes 42, input electrodes 50 and an interposed ground electrode 58. The open repetitive array of supply and input electrodes 42 and 50 is shown as U-shaped portions, but may as well be other open type geometric figures.

Figure 9:
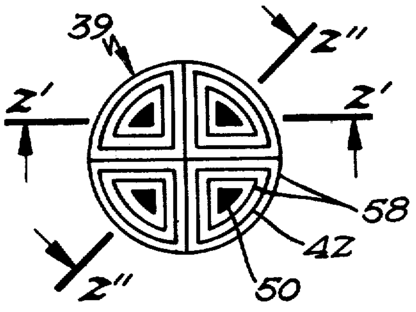

In FIG. 9, another example of the closed repetitive array of FIGS. 4, 5, and 7 is shown as a clustered array.

Figure 10:
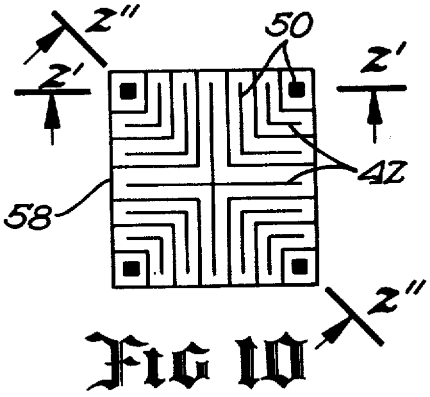

In FIG. 10 another example of the open repetitive display of FIGS. 1, 6, and 8 is shown as a clustered array.

Figure 11:
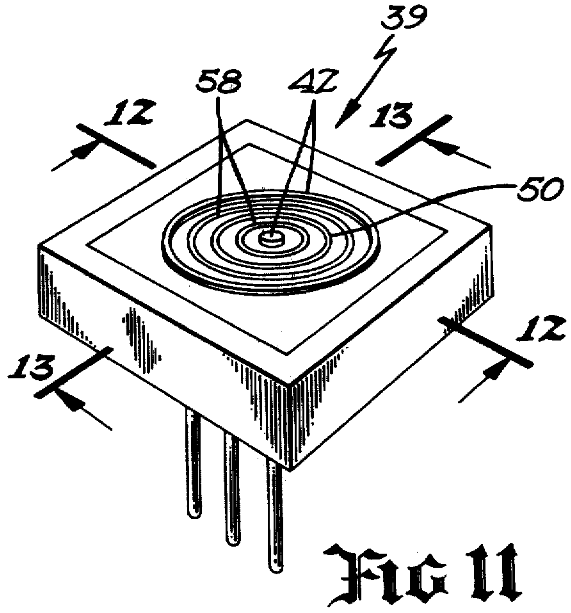
Figures 12, 13, 16, 17:
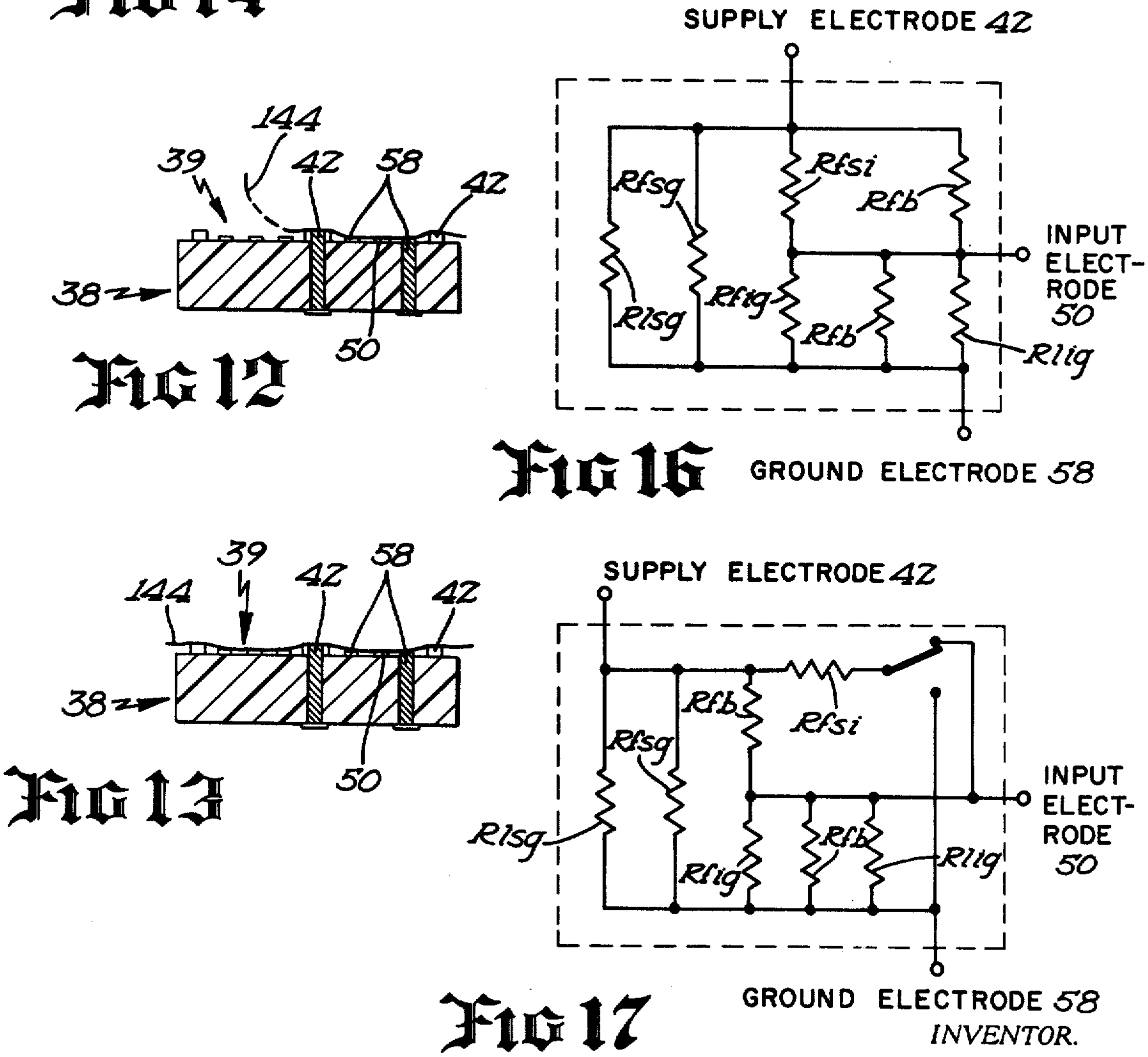
FIGS. 12 and 13 show cross sectional views of a touch sensitive electronic switch according to section lines 12—12 and 13—13 in FIG. 11.

In FIGS. 11–13, another example of a closed repetitive array is shown having a supply electrode 42 as the centermost electrode.

In FIGS. 14–17, schematic representations of models of various distributed or bulk finger or leakage resistances of switch 30 of the present invention are shown which have been devised to aid in the explanation of various effects of switch 30. An explanation of the designation of the various resistors is as follows:

R*lsg* represents the leakage resistance between supply electrode 42 and ground electrode 58. It is recognized that this electrode is a distributed resistor across switch face 39 of switch 30 of the present invention but may be conveniently represented as a conventional lumped resistor for purpose of explanation.

R*lig* represents the leakage resistance between input electrode 50 and ground electrode 58. R*lig* is similarly a distributed resistance which is represented by a lumped resistor.

R*fsi* is the surface resistance of a finger in contact with the electrodes of switch 30 of the present invention and in particular the surface resistance between the supply electrode 42 and input electrode 50. R*fsi* is the surface resistance of the finger of an operator which, when bridging between supply and input electrodes 42 and 50, lowers the D.C. resistance across the face of switch 30 and provides an actuation of the switch. R*fsi* is also a distributed resistance which is represented by a lumped resistor.

R*fsg* is similarly the surface resistance of a finger between supply electrode 42 and ground electrode 58.

R*fsg* is further similarly the surface resistance of a finger between the input electrode 50 and ground electrode 58.

R*fb* is a lumped resistor representing the bulk resistance of the finger rather than the surface resistivity represented by R*fsi*, R*fsg*, and R*fig*.

Figure 18:
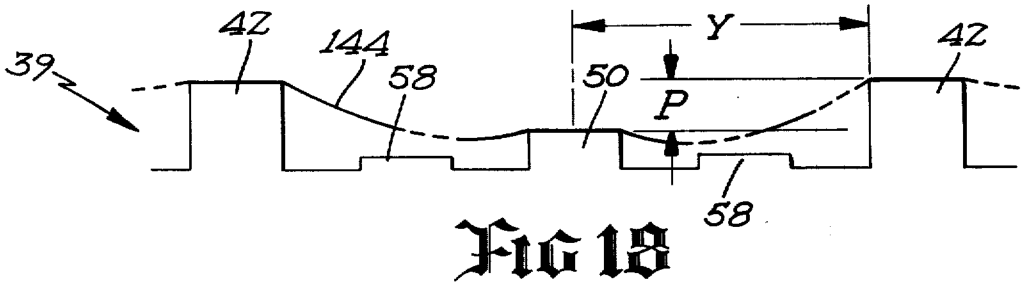
FIG. 18 shows an enlarged, partial, cross sectional view of a touch sensitive electronic switch similar to the view shown in FIG. 2 and useful in explaining its operation.

In FIG. 18, an enlarged, cross sectional, partially schematic representation of a portion of electronic switch 30 of the present invention is shown including the supply electrodes 42, input electrode 50, and ground electrodes 58. A finger portion 144 is positioned to bridge between supply electrode 42 and input electrode 50 to thereby provide an actuation of the switch in a manner which avoids touching of ground electrode 58, the importance of which will be discussed hereinafter.

Figure 20:
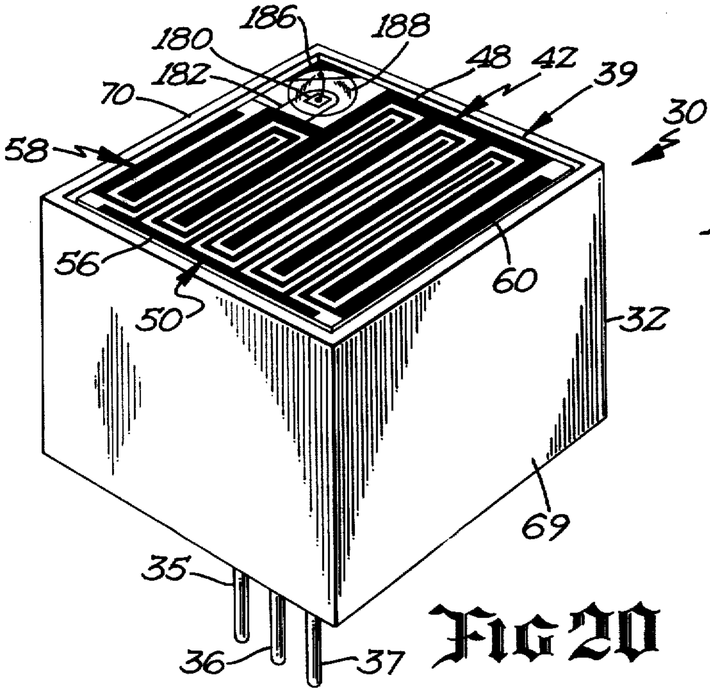
FIGS. 20 and 21 show an additional embodiment of a touch sensitive electronic switch according to the present invention including a light emitting diode.
Figure 21:
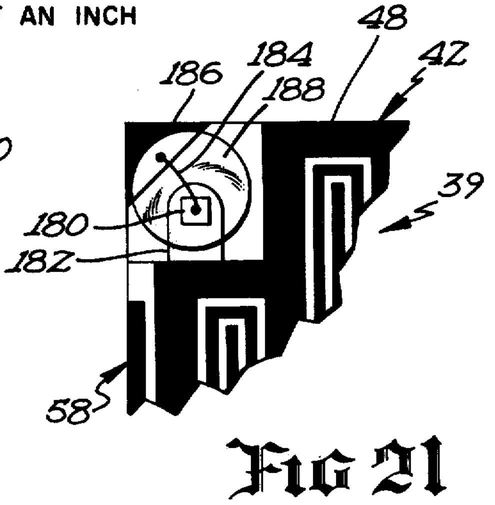

In FIGS. 20 and 21, electronic switch 30 of the present invention is shown as in FIG. 1 except with the configuration of switch face 39 altered to include a light-emitting diode (hereinafter LED) 180 attached to a metalization 182 extending from supply electrode 42 in the left rear corner of switch face 39. A wire bonded lead 184 is connected between the chip 180 forming the LED and a further metalization 186 at the left rear corner of switch face 39. A quantity of clear, translucent, or transparent plastic or other material 188 is shown as deposited over LED 180 and its associated metalization and lead to protectively cover LED 180 and yet allow light from LED 180 to be seen through the protective covering 188.

OPERATION

Generally, in operating the touch sensitive electronic switch 30 shown in the Figures, the finger of an operator is placed upon the switch face 39, for example as shown by the finger portion 144 shown in FIG. 2. The electrical skin resistance of the operator causes a direct current path to be set up between at least one of the components of input electrode 50 and at least one of the components of supply electrode 42 to actuate the switch by causing a small current to flow between these electrodes. The current flowing is generally in the nanoampere range (30–300 nanoampere) with normal skin resistances and supply voltages of approximately 5 volts. This D.C. input current is amplified by the various stages of composite amplifier 74 shown in FIG. 3 to a point where at least output transistor 144 saturates and approximates an electronic switch in the closed or ON condition to the electrical load 82, thus connected to supply terminals 80 and 86. When the operator's finger 144 is removed from switch 30, the characteristics of the switch discussed below prevent input current from reaching input 72 of composite amplifier 74 and rapidly render the amplifying stages to and including output transistor 144 nonconducting. Thus, with the operator's finger removed from switch 30, composite amplifier 74 appears as an electronic switch in an open or OFF condition to load 82, and no current is allowed to flow in the electrical load.

In particular, ground electrode 58 is connected to a reference point within direct current amplifier 74. That is, ground electrode 58 is connected to the lowest potential point in the electronic circuit to which the input electrode 50 and supply electrode 42 are connected. By its interposition between the input electrode 50 and the supply electrode 42, leakage current attempting to flow between the input electrode 50 and the supply electrode 42 first encounters the conductive electrical shielding effect of ground electrode 58 and is conducted to such reference or ground. Thus, the electrical shielding of ground electrode 58 prevents a flow of leakage current between the input electrode and the supply electrode tending to set up a nonactuated direct current path from the input electrode to the suppy electrode, i.e., without actuation of the switch by the finger of an operator. Thus, a nonactuated direct current path between the input electrode 50 and supply electrode 42 is one such as may be caused by leakage current in the switch and not by touching of the switch face by the operator's finger or other external cause.

It is not necessary, however, that electrode 58 be connected to the ground point in the D.C. amplifier. Electrode 58 may be connected to any potential supply of a voltage below that of the supply voltage to the amplifier and yet provide some shielding. It is apparent, however, that the maximum shielding is provided when electrode 58 is in fact connected to the reference, ground, or common point of the D.C. amplifier to which swich 30 is connected.

As an example of the effectiveness of ground electrode 58, the original application discloses an electronic switch which requires a surface resistance across the switch of greater than 1,000 megohms, with a 5 volt supply voltage and a D.C. amplifier of a gain of $10^6$, in order to maintain a nonactuated output current below 5 milliamperes. With the shielding effect of electrode 58 of the present invention, a resistance across switch 30 as low as 20 megohms with a 5 volt supply and again a D.C. amplifier of a gain of $10^6$ will result in an output current in the nanoampere range which is solely determined by the leakage current of the last amplifier stage.

It is to be noted that actuation of the switch 30 of the present invention is made without moving parts, aside from movement of the operator's finger. That is, each of the supply electrode 42 and input electrode 50 is laterally immovably attached to ceramic 38. Laterally immovably attached, for the purposes of this invention, is defined as where the input and supply electrodes are fixed with respect to each other in a manner to prevent the input electrode from coming into direct electrical contact with the supply electrode. Either electrode may be made vertically movable, as by using a soft or spongy material or springs to give the effect or feeling of vertical movement to an operator's finger. Other means for effecting this illusion of vertical movement upon actuation will be envisioned by those skilled in the art.

Composite amplifier 74 of FIG. 3 as shown is arranged for fabrication as an integrated circuit. That is, transistor 130 is necessary because of present integration methods. If composite amplifier 74 were to be fabricated of discrete components or as a hybrid of metalization and separate transistor chips bonded to the metalization, resistor 128 could interconnect input 72 of the composite amplifier 74 and junction point 92 of first amplilfier 94. Also, the connections of electrodes 42 and 58 would be inverted such that electrode 42 would connect to terminal 86 and electrode 58 would connect to terminal 80 to thus provide the appropriate bias to transistor 132 upon the bridging of electrodes 42 and 50 by the finger of an operator. In this arrangement, terminal 80 functions as the ground, reference, or common terminal of the circuit. Terminal 80 in this arrangement could also be an actual ground point in the circuit if a negative supply voltage were applied to terminal 86. As will be realized by those skilled in the art, this latter arrangement of voltages yields an identical result to the arrangement shown in FIG. 3 with the exception that the opposite terminal functions as an actual ground point in the circuit. Thus, the only requirement upon the connection of electrode 58 and electrode 42 is that they connect to opposite voltage points, in this case supply terminals, and the connection of electrode 58 is to a reference terminal in that the terminal has a D.C. potential which will in fact shield the input to the amplifier 74 to some extent, as discussed above. Thus, the remaining discussion of amplifier 74 will be without transistor 130.

Resistor 128 performs a current limiting function in the event electrode 42 is directly shorted to electrode 50, for example by a fragment of metal placed on the face of the switch. Thus, the value of resistor 128 is dependent upon the voltage supply and the maximum base-emitter current tolerable by the first transistor.

A requirement of the transistor used as the first or input transistor 74 is that this transistor must have some current gain at input currents on the order of 10–100 nanoamperes. This is because current gain should be available from this transistor for voltage supplies as low as 5 volts and with skin resistance on the order of 100 megohms. Therefore, the composite amplifier 74 of the present invention has the advantage of accepting an extremely low input current and yet provide gain.

Resistor 102 also provides a current limiting function in preventing unbounded current from flowing from supply terminal 80 through the collector-emitter of transistor 132, the base-emitter of transistor 134, the base-emitter of transistor 136, and the base-emitter of transistor 144 to supply terminal 86. Thus, the value of resistor 102 is dependent upon the maximum currents tolerable through these junctions.

The arrangement of transistors within amplifier 108 is termed a type of Darlington arrangement in that a conventional Darlington arrangement would dictate that the collector of transistor 134 be directly connected to the collector of transistor 136, both collectors be connected directly to supply terminal 80, and the emitter of transistor 134 be directly connected to the base of transistor 136, thus necessitating the removal of resistors 138, 122, and 142.

Resistor 142 has been found to improve amplifier characteristics with switch 30 in a nonactivated condition in that leakage current flowing through transistor 134 can be shunted through resistor 142 rather than into the base of transistor 136 where it may be amplified to increase the output current flowing through transistor 144 and thus degrade the desired open or OFF effect of composite amplifier 74. It has further been found that if resistor 142 has a maximum value of approximately one-tenth of the nonconductive input resistance of transistor 136, this shunting of leakage current is accomplished, and resistor 142 prevents an increased output current from the composite amplifier. Of course, resistor 142 can be reduced in value to increase its shunting effect, however, a point is reached at which the voltage dividing effect of resistor 142 and resistor 138 degrades the gain of amplifier 108 below the gain necessary to provide an appropriate output current. Thus, the composite amplifier 74 of the present invention has the advantage of extremely low output current when switch 30 is not actuated. Output current is in the order of the leakage current of transistor 144.

Resistors 104 and 119 provide a leakage current shunting effect in a similar fashion to resistor 142.

Resistors 138 and 122 provide a current limiting function similar to the current limiting function of resistor 102 and further provide for a dampening of any oscillation within the amplifier because of its exceedingly high gain.

The use of a PNP transistor within first amplifier 94, with a base emitter voltage offset of negative to positive in conjunction with the NPN transistor 134 within second amplifier 108 with a base emitter voltage offset of the opposite polarity, positive to negative, allows the voltage offset appearing at input 92 to be simply the voltage offset required by a single transistor. It is to be noted that the same effect is achieved by the use of transistor 130. Thus, the composite amplifier 74 of the present invention requires a low ofset voltage at its input.

The connection of the collector of transistor 144 directly to load resistor 82 rather than the connection of the collectors of transistors 134, 136, and 144, which is a functional arrangement for a conventional Darlington circuit, allows composite amplifier 74 to provide an extremely low voltage across its output when electronic switch 30 is actuated and a conducting or ON condition is desired. If the collectors of transistors 134, 136, and 144 were to be connected together, the lowest voltage obtainable across the collector-emitter junction of transistor 144 can be seen by a voltage level analysis to be dependent on the parameters of prior circuit elements, and does not reach the low level obtainable from a single transistor. By the arrangement shown, no such high voltage output obtains, and the voltage output is the saturated voltage output of transistor 144, which is extremely low. Thus, a low output voltage is provided by composite amplifier 74 of the present invention in the conducting or ON condition.

From the foregoing it is believed that one skilled in the art can adequately select circuit parameters to insure proper performance. One such set of values found to perform well with the normal 30–100 nanoamperes input expected from the bridging of supply electrode 42 and input electrode 50 to provide an output current from 5 to 150 milliamperes with a supply voltage of 25 volts is as follows:

Resistor 102—10 to 100 kilohms
Resistor 104—1 megohm
Resistor 119—1 megohm
Resistor 122—2.2 kilohm
Resistor 128—2.2 kilohm
Resistor 138—10 kilohm
Resistor 142—1 megohm
Transistor 132—2N3906
Transistors 134 and 136—2N997, 2N998, 2N999
Transistor 144—2N2222A The use of the 2N997-9 for transistors 134 and 136 will cause a slight change in the circuitry shown in FIG. 3 because both transistors 134 and 136 are physically on a single integrated circuit chip contained within a single package as a Darlington circuit. Resistors 122 and 138 are combined into a single resistor of approximately a value of 1.8 kilohms since the collectors of transistors 134 and 136 are internally connected and only one lead issues from the 2N997-9 package.

Thus, a composite amplifier has been described which eliminates any need for capacitors, includes only direct current coupled stages, provides a high gain, provides a low voltage output in the ON condition, provides a low output current in the OFF condition, has the ability to operate with very low input current, and provides a low voltage offset as its input.

In FIGS. 6–10, examples of the two types of arrays of elements possible with the electronic switch of the present invention are shown, the open array and the closed array. FIGS. 6, 8, and 10 are examples of open arrays of electrodes 42 and 50, and FIGS. 7 and 9 are examples of closed arrays of electrodes 42 and 50 where these electrodes are formed in closed paths.

The reasons that the open ended, open array of FIG. 1 is deemed to be preferred may now be explained. For manufacturing economy, it is desirable to minimize the number of connections made through ceramic 38. Thus for the three electrodes required by the present invention, the minimum number of connections is three. This minimum number is achieved by requiring each of electrodes 42, 50, and 58 to be continuous in nature so that no additional connections are required, under the assumption that no connections may be made upon the face 39. Thus, the noncontinuous configurations of electrodes shown in FIGS. 7, 8, 9, and 10 are less preferred.

Further manufacturing economy may be had by allowing edge-coating of connections to electrodes rather than connections through ceramic 38. The open ended, open array of electrodes of FIGS. 1 and 2 allows this economy, as explained above. It is to be noticed that the open ended, open array of FIGS. 1 and 2 has this advantage over the similarly configured non open ended, open array of FIG. 6 with a completely encompassing electrode 58; however with the FIGS. 1 and 2 array, the precautions on the connection of electrode 58 as discussed above to prevent a practical, contaminable leakage path between supply electrode 42 and input electrode 50 must be adhered to.

Thus, the interdigitated array of FIGS. 1 and 2 of the continuous, open ended, open type is preferred for manufacturing economy.

It has been found advantageous if ground electrode 58 cannot be touched along with supply and input electrodes 42 and 50. This can now be explained by reference to FIGS. 11–18.

In FIG. 12, a cross sectional view of the closed repetitive array of electrodes forming switch 30 of the present invention represented in FIG. 11 is shown. A finger portion 114 is shown as it would appear in a situation where the finger of an operator bridges electrodes 42 and 50 to cause a lowering of the D.C. resistance across the face of switch 30, and ground electrode 58 is also touched, as shown.

Figure 14:
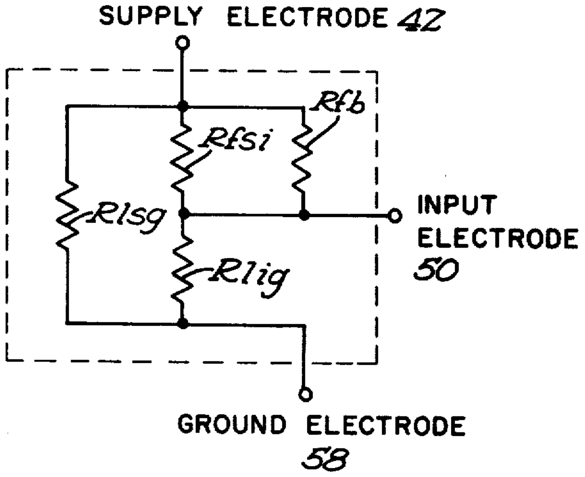
FIGS. 14–17 show schematic representations of models of a touch sensitive electronic switch according to the present invention useful in explaining its operation.

Before proceeding further, reference is had to FIG. 14 which illustrates a schematic representation of a proper finger placement where the finger of an operator merely bridges supply and input electrodes 42 and 50. In FIG. 14, $R_{lsg}$ has no operative effect if ground electrode 58 is connected to the reference of a circuit. That is, if ground electrode 58 is connected to an intermediate voltage point in the circuit, $R_{lsg}$ must be considered, but under the consideration that ground electrode 58 is in fact the ground or reference point of the circuit to which it is connected, $R_{lsg}$ can provide no current or voltage to input electrode 50 but merely increases the current between supply electrode 42 and ground electrode 58. Also, since $R_{fb}$ is on the order of ten times $R_{fsi}$, its resistance may be considered as combined with $R_{fsi}$. Under these considerations, the voltage at input electrode 50 is seen to be the voltage division between $R_{fsi}$ and $R_{lig}$. Since in a normal case $R_{lig}$ is much greater than $R_{fsi}$, the greatest percentage of the voltage at supply electrode 42 will appear at input electrode 50.

Figure 15:
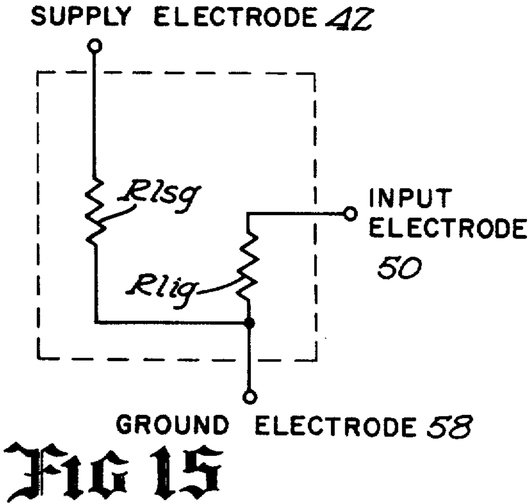

FIG. 15 shows a schematic representation of switch face 39 with the operator's finger removed. Leakage current through $R_{lig}$ with the operator's finger removed can be beneficial in that, together with amplifier 74, it: stabilizes the performance of amplifier 74, reduces the output current provided by amplifier 74 in nonactuated condition; and provides a failure mode nonactuated condition. That is, with an extremely high degree of contamination of swtich face 39, the leakage current between input electrode 50 and ground electrode 58 will prevent an actuation of the switch, rather than cause an actuation of the switch.

The detriment of allowing an operator's finger to contact supply and input electrodes 42 and 50 and ground electrode 58, as shown by finger 114 in FIG. 12, may now be explained with reference to the schematic representation of that situation shown in FIG. 16. It is to be noted that in addition to the lumped resistors shown in FIG. 14, R*fsg* is added in parallel to R*lsg*. Again, if ground electrode 58 is in fact the reference point of the circuit, the only effect of R*fsg* is to draw more current between supply electrode 42 and ground electrode 58.

A more serious effect results from the addition of R*fig* in parallel with R*lig*. Normally, R*fsi* is approximately equal to R*fig*, and normally R*fig* is much much less than R*lig*. Therefore, the voltage produced in input electrode 50 is approximately one-half of the voltage between supply electrode 42 and ground electrode 58. If the voltage provided to supply electrode 42 is quite low, this can be a serious detriment, as discussed above.

FIG. 13 illustrates another possible situation which can be caused by a finger placement on switch face 39 contacting the supply and input electrodes 42 and 50 and also ground electrode 58. In FIG. 13, finger portion 44 covers the entire closed repetitive configuration switch, and makes good contact with all electrodes over their entire circumference. This effect is representative of what is termed occlusion and is schematically represented in FIG. 17.

In FIG. 17 R*fsi* is schematically represented as connected to an electronic switch having one terminal connected to input electrode 50 and a second terminal connected to ground electrode 58. As the finger portion 144 is first placed upon switch face 39, contact is made between supply and input electrodes 42 and 50, and in the case of the configuration of FIG. 13, with ground electrode 58. Thus, the ground electrode touching situation occurs which is illustrated in FIG. 16 and also in FIG. 17 with the electronic switch as shown connecting R*fsi* to input electrode 50. If the finger portion 144 comes to an occlusion position, the schematically represented electronic switch disconnects R*fsi* from input electrode 50 and connects R*fsi* to ground electrode 58. That is, because of the interposition of ground electrode 58 and because finger portion 144 is considered in the occlusion situation to be contacting the entire circumference of the ground electrode, all current flowing through the surface resistance of finger portion 144 is shunted to ground through electrode 58, and in the occlusion condition there is no current conducted from supply electrode 42 to input electrode 50 through the surface resistance of finger portion 144. There remains, however, R*fb* between supply electrode 42 and input electrode 50 representing the bulk resistance of the finger between these electrodes as opposed to the surface resistance. However, since R*fb* has been indicated to be approximately 10 times either R*fsi* or R*fig*, the voltage appearing at input electrode 50 from a voltage impressed between supply electrode 42 and ground electrode 58 is seen to be approximately one-tenth of the voltage applied. Thus, for a 5 volt supply, the voltage appearing at input electrode 50 again may be insufficient to fully forward bias the base emitter junction of the input NPN transistor of amplifier 74, and no full actuation of switch 30 can be made.

It is to be noted that the interdigitated array of FIGS. 1 and 2 of the open ended, open type prevent an occlusion situation from occurring. That is, with the interdigitated array and with the wrap around connection of reference electrode 58 making a side to side connection, if any, on the bottom 40 of ceramic 38, there is no possible position where the finger of an operator can touch the entire circumference of a reference electrode 58 completely surrounding an input electrode to prevent a current flow to the input electrode, i.e., to conduct all current flowing through the surface resistance of the operator's finger to ground through electrode 58.

Even with the interdigitated array of FIG. 6 of the open type occlusion can occur of the entire array can be covered by the operator's finger to thus conduct all current flowing through the surface resistance of the operator's finger from the supply electrode 42 to the reference electrode 58. It is possible with the array of FIG. 6 or others to prevent occlusion by making at least a portion of electrode 58 inaccessible to the operator's finger, by using a wrap around connection for electrode 58 as discussed in connection with FIGS. 1 and 2, or in the case of FIG. 6, by requiring the array to be of significant size with respect to the operator's finger.

Thus, the interdigitated array of FIGS. 1 and 2 of the continuous, open ended, open type is preferred for manufacturing economy as discussed above and is preferred for ease of rendering the array free from occlusion problems. It is possible, however, with the interdigitated array of FIGS. 1 and 2 to have the ground electrode touching situation. The schematic representation of FIG. 18 illustrates how this may be prevented altogether.

In FIG. 18, a finger portion 144 is illustrated in a position representing a maximum compressibility of the skin of an operator; that is, the force supplied by the operator downward upon the face of switch 39 has contorted the skin of the operator's finger to its maximum compressibility limits. As is seen in FIG. 18, if the height of electrodes 42 and 50 is sufficiently greater than the height of electrode 58, keeping in mind the relationship which must exist between the height of electrode 42 and the height of electrode 50, as will be discussed hereinafter, ground electrode 58 cannot be touched even in the situation where the maximum compressibility limits of the skin have been reached. It is to be noted that FIG. 2 uses this technique of preventing the occurrence of the ground electrode touching situation.

A specific arrangement and relationship of the present invention between the heretofore set out parts of electronic switch 30 may now be explained. It has been found that it may be advantageous if the relationship between the level of the top surface of input electrode 50 and the level of the top surface of supply electrode 42 and the lateral spacing between input electrode 50 and supply electrode 42 is such that P is at least equal to R minus the square root of the quantity $(R^2 - Y^2)$, where P represents the height differential between the level of the top surface of input electrode 50 and the level of the top surface of supply electrode 42, and Y represents the lateral spacing between input electrode 50 and supply electrode 42, as illustrated in FIG. 18. R represents the curvature of the smallest finger expected to operate the electronic switch of the present invention.

That is, the mathematical expression may be set out as follows:

$$P = R - (R^2 - Y^2)^{1/2}$$

The height differential is directly related to the touch threshold or touch sensitivity of the electronic switch 30 of the present invention. That is, with a height differential in excess of P as established by the above expression, the bottom of the finger must be further extended from the point at which the inside edge 164 of component 43 of electrode 42 is first touched by the finger of an operator to the point at which the bottommost portion of the finger of an operator first touches the input electrode 50.

The curvature of the operator's finger can be most simply expressed as an approximate radius. That is, most fingers range from between one-eighth of an inch radius to four-eights of an inch radius. However, if it is desired to obtain a more exact relationship, the curvature of the finger may be expressed as a mathematical expression and this expression substituted for R in the formula for P. In general, it has been found sufficient to determine the approximate radius of the smallest finger expected to operate the electronic switch 30 of the present invention and use that particular number for R in the expression for P as a worst case condition.

Y is the lateral spacing between the electrodes as taken, for example and with respect to FIG. 1, between the center line of a component of the input electrode 50 and the inside edge 164 of a component of the supply electrode 42. Y is best illustrated in FIG. 18.

The above set out methematical relationship of the present invention allows a switch design minimizing the touch sensitivity or threshold of the switch, if desired, and yet insuring a height differential between the electrodes which will allow grounding of all voltage in an operator's body by the supply electrode 42 before a direct current path is set up between the supply electrode 42 and the input electrode 50. As explained in the original application, if it were possible to touch the input electrode 50 without first touching the supply electrode 42, the usual alternating voltage induced into the operator's body from external sources would cause the switching system to turn ON and OFF at the alternating frequency, typically 60Hz. That is, in the normal case where input electrode 50 is arranged to be connected to the input of a D.C. amplifier, the alternating voltage existing in the operator's body can alternately turn the D.C. amplifier ON and OFF and thus cause an alternating switch output, i.e. where the output turns ON and OFF at the alternating frequency. Where a D.C. switch output is desired upon contact of the operator's finger with switch face 39, this is a detrimental result. Since supply electrode 42 is arranged to be connected to a voltage supply terminal of the D.C. amplifier, insuring that the operator's finger first contacts supply electrode 42 insures that the alternating voltage within the operator's body will be conducted to A.C. ground or to circuit ground to give reference to the switch through the supply terminal. Also, static electricity within an operator's body can exist within a range of 1,000 to 10,000 volts, and any rapid discharge of this static electricity through input electrode 50 and to the input to D.C. amplifier 74 can damage the input stage. It is thus also best for the purposes of discharging the static electricity that the finger of an operator first discharge the static electricity through supply electrode 42. It is further desirable if supply electrode 42 has sharp corners to thus provide the best discharge path. Thus, when the operator's finger makes contact with the input electrode 50, the alternating voltage has been eliminated and what remains is a D.C. bridging of electrodes 42 and 50 to provide a lowering of D.C. resistance across switch face 39 thus providing an actuation of the switch and its associated D.C. amplifier. The elimination of the voltage within the operator's body is particularly important since the current input to the D.C. amplifier can be as low as 30 nanoamperes, which can be easily overshadowed by the current caused by the alternating voltage within an operator's body or the amperage range current which can be caused by a rapid discharge of the static electricity within an operator's body.

By use of the relationship of the present invention between P, Y, and R, the minimum depth between the input electrode 50 and the supply electrode 42 may be determined. That is, the height differential can be determined at which a finger of a given radius can contact an electrode 50 which is set below the level of an electrode 42 arranged around and about electrode 50.

It has further been found that in order to reliably insure that the finger of an operator will in fact contact the supply electrode before contact is made with the input electrode to allow the harmless grounding or referencing of voltage in the operator's body, the height differential for which the switch 30 of the present invention should be designed exceeds the minimum. That is, the practical measure of P should exceed the quantity R minus the square root of the quantity $(R^2 - Y^2)$ to allow for manufacturing tolerances, differing finger characteristics as far as the ability of the skin to compress, various finger placements upon switch 30, and to allow for a variance of the touch threshold. That is, once the relationship of parameters of the present invention is known, the height differential between the electrodes may be set beyond the minimum necessary to insure grounding or referencing of voltage within an operator's body and to such an increased level as desired to establish a particular touch threshold for the switch. Applications may be desired where the touch threshold is extremely light for all ranges of fingers, such as a general purpose application. Other applications may be desired where the touch threshold is exceedingly heavy, such as in a switch which may be used on an armament where an undesired actuation would cause an extremely dangerous condition. Further applications may be desired with intermediate touch thresholds.

Figure 19:
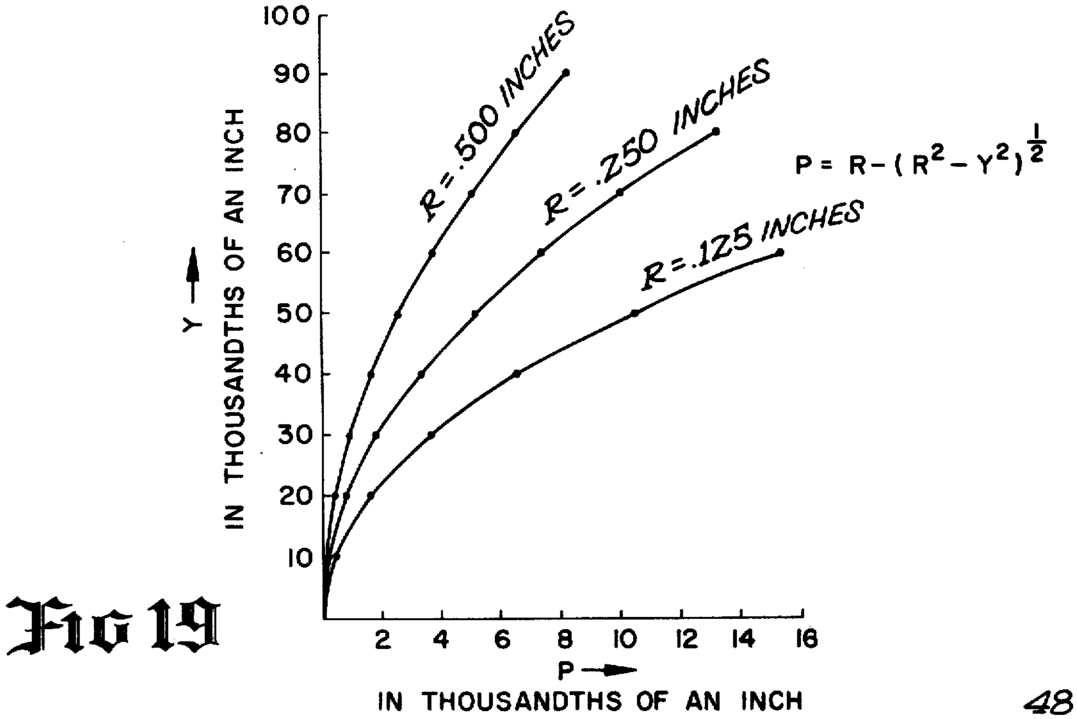
FIG. 19 is a set of curves generated from a basic relationship which may be used with touch sensitive electronic switches according to the present invention.

In particular, FIG. 19 graphically illustrates the above set out relationship between P, Y, and R. From FIG. 19, it can be observed that for a value of Y equal to fifty thousandths of an inch, a P of approximately three thousandths of an inch must be maintained for a finger of one-half inch in radius while a P of approximately ten thousandths of an inch must be maintained for a finger of one-eighth inch in radius, the smallest finger graphed. With P set to the value required by the minimum radius finger intended to operate switch 30 of the present invention, the difference in touch threshold for the one-half inch finger at Y equals fifty thousandths is approximately 1 ounce, highly acceptable. That is, since a value of P of only three thousandths of an inch is required for a finger of one-half inch in radius, the difference between the ten thousandths used and the three thousandths figure represents a seven thousandths increased threshold for a one-half inch finger. At Y equals fifty thousandths of an inch, this increased seven thousandths threshold results in approximately 1 ounce difference in the threshold force necessary, which is highly acceptable.

With Y equal to fifty thousandths of an inch, a spacing of one hundred thousandths of an inch (twice Y) exists between, for example and with reference to FIG. 2, the rightmost edge 164 of conductor 43 and the leftmost edge of conductor 44. P, the vertical distance between the height of conductor 43 and the height of conductor 51, of ten thousandths of an inch should be maintained to allow for the smallest finger intended to operate the switch 30 of the present invention, assumed to be one-eighth of an inch in radius.

It can also be seen from FIG. 19 that for a value of Y significantly greater than fifty thousandths of an inch the differing values of P for minimum and maximum fingers rapidly diverges. That is, for a Y within the range of fifty thousandths of an inch, the variance in the thresholds between the largest finger and the smallest finger intended to operate the switch 30 of the present invention can be tolerated. For a value of Y out of the range of fifty thousandths of an inch, the large vertical offset, P, required for the smallest finger intended to operate switch 30 of the present invention establishes an intolerably high touch threshold for the largest finger, on the order of several pounds.

It can further be seen from FIG. 19 that for a value of Y equal to thirty five thousandths of an inch, the P necessary for the smallest finger is approximately five thousandths and the P necessary for the largest finger is approximately one thousandth, for a difference in P of four thousandths of an inch. It has been found that a four thousandths of an inch difference at a value of Y equal to thirty five thousandths results in a threshold difference of less than an ounce, which is hardly noticeable. In fact, a value of Y equal to thirty five thousandths is deemed an optimum value when consideration is given to the findings that: the thickness factor of the skin of the finger increases at the very small spacings thus limiting its ability to extend to any depth and actuate the switch 30 of the present invention; present manufacturing capability at low cost is limited for very small spacing; it is desirable to minimize any effect of the critical placement of an operator's finger on the switch face 39; and it is desirable to minimize the effect of the size of an operator's finger in operating switch 30 of the present invention. That is, in selecting the dimensions of a switch face 39 of the present invention, it has been found that where the dimensioning and spacing of the electrodes is significantly less than the radius of the smallest operator's finger expected to operate the switch, the critical nature of the operator's finger is substantially eliminated as a factor in actuating the switch. At the least the effect of the size of the radius of an operator's finger is minimized and the effect of placement of an operator's finger on switch face 39 is minimized.

The effect of the size of the radius of an operator's finger is minimized in that if operators having variously sized fingers operate the switch 30 of the present invention, little effect is had on the parameters, for example on the touch threshold. As described above with respect to the discussion of the touch threshold, the differences in the touch threshold for fingers of various sizes is tolerable for values of Y within the range of fifty thousandths of an inch and is difficult to notice for a spacing of thirty five thousandths of an inch. That is, with respect to FIG. 2, for dimensions of in the range of one hundred thousandths of an inch between the conductors of supply electrode 42 (twice Y), the variance in touch threshold is tolerable. The exact dimensioning of each electrode is somewhat a matter of choice, consonant with the teachings herein, but must of course be compatible with the spacing requirements set out above. Thus, if Y is chosen to be sufficiently small, the effect of the size of the operator's finger can be minimized.

The effect of placement of the operator's finger upon switch face 39 can also be minimized by use of an array of electrodes where the dimensioning and spacing of the electrodes is significantly less than the radius of the smallest operator's finger expected to operate the switch. As used herein, the word "array" has its normal meaning of a particular arrangement of several electrodes where the particular arrangement is chosen by the designer. Notice that in the switch apparatus 30 of FIGS. 4 and 5, it is possible by constructing switch face 39 of a size comparable to an operator's finger that the operator place a finger on switch face 39 in a manner which will not allow the lateral bridging between supply electrode 42 and input electrode 50 and thus not allow current to be conducted through the resistance of the operator's finger between these electrodes and cause a lowering of the D.C. resistance between them to thereby provide an actuation of the switch apparatus. Of course, upon realizing that no actuation has occurred, the operator can yet change the positioning of the finger to actuate switch 30; however, a better arrangement is to substantially eliminate any critical nature of the placement of an operator's finger as a factor in actuating switch 30. It is to be noticed that FIGS. 1 and 2 achieve this end since the preferred spacing between the components 43–47 of supply electrode 42 is seventy thousandths of an inch (twice Y) which is significantly less than the radius of the smallest finger expected to operate switch 30 of the present invention, which was indicated in FIG. 19 as one hundred and twenty five thousandths of an inch. Thus, placement of the operator's finger at any point upon the switch face will allow the bridging of one of the component's 43–47 of supply electrode 42 and one of the components 51–54 of input electrode 50 to thereby provide the bridging between the electrodes and the actuation of the switch. In fact, it is believed that a concerted effort need be made to avoid actuation of the switch. Therefore, the dimensioning and spacing of the electrodes of switch 30 substantially eliminates the critical nature of placement of the operator's finger as a factor actuating the switch.

It is to be noticed that the same effect occurs with the clustered arrays such as shown in FIGS. 9 and 10.

Thus, the spacing Y and the dimensioning of electrodes of switch 30 are chosen to substantially eliminate the critical nature of the operator's finger as a factor in actuating the switch and the maximums of these parameters are chosen in a manner set out herein. The minimum values of spacing and dimensioning reflect two considerations. First, for extremely narrow spacings and dimensionings, the cost of manufacture of the switch 30 under present techniques becomes excessive. Another factor limiting the minimum dimensioning and spacing of the electrodes is the finding that the thickness factor of the skin of an operator's finger increases at very small dimensioning where the skin flexibility is determined more by skin effects than by flesh effects. Thus, there are at least two practical limitations upon the minimum spacing and dimensioning, and the preferred spacing and dimensioning is set out below.

The next parameter of switch face 39 which may be chosen is the minimum value of P, the vertical offset between the supply and input electrodes. The formula given with respect to FIG. 19 sets the minimum value of P. In the preferred embodiments, the value of R used to determine the minimum value of P is the smallest finger for which the designer intends practical use of the switch. As explained above, if the radius of the smallest finger is used in a determination of the minimum value of P, the value of P so derived is also appropriate for all larger fingers. Additional height may be added to P to set a particular touch threshold for the switch; that is, as explained above, additional height added to P yields an increasing touch threshold to switch 30 which can be set to a desired value.

Next, a decision must be made as to whether it is allowable that reference electrode 58 be touched along with bridging of supply electrode 42 and input electrode 50. Assuming a decision that reference electrode 58 is not to be touched, the dimensioning of the various other electrodes must be set so that it cannot be touched. With reference to FIG. 18, it can be seen that if the position of finger 144 is considered to be at the maxiumum compressibility of finger 144, it is not possible for reference electrode 58 to be touched. That is, by positioning the level of the top surface of the array of reference electrodes sufficiently below the level of the top surface of the array of input electrodes and supply electrodes, the maximum compressibility limits of the finger of the operator, and more particularly of the skin of the finger of the operator, is exceeded, and this arrangement insures that reference electrode 58 is not touched by the operator's finger with the touching of supply electrode 42 and input electrode 50. It may be stated generally that it has been found that with increasing thickness of the skin of an operator' s finger, less of a height difference is required to avoid the touching of ground electrode 58 as the spacing between electrodes 42 and 50 decreases for spacing within the range of fifty thousandths of an inch.

The preferred manner in which reference electrode 58 is positioned below the maximum compressibility limits of the finger of the operator is to raise the level of the top surface of the array of input electrodes sufficiently above the level of the top surface of the array of reference electrodes to achieve this result.

Next, the height of the level of the top surface of the array of components forming supply electrode 42 is determined by adding the height P necessary to prevent input electrode 50 from being first touched, the height dictated by the touch threshold desired, and the height of the level of the top surface of the array of components forming input electrodes 50 set as indicated above.

The preferred value of Y is thirty five thousandths of an inch. Assuming it is not desired to touch the reference electrode 58 with the bridging of electrodes 42 and 50 and assuming reference electrode 58 is screened onto ceramic 38 to a height of about one thousandth of an inch, it has been found that the height of the top surface of the array of components forming input electrode 50 on the order of ten thousandths of an inch above the level of the top surface of the array of components forming reference electrode 58 while possibly not beyond the maximum compressibility limits of the smallest finger, requires a touch threshold force of several pounds before reference electrode 58 can be touched. The level of the top surface of the array of components forming supply electrode 42 is then determined by adding the height P from the formula, five thousandths of an inch, the height dictated by the touch threshold desired, and eleven thousandths of an inch, the height of the surface of the array of components forming input electrode 50.

It has been found that an optimum set of values is: Y between twenty and forty thousandths of an inch; the height of the level of the top surface of the input electrode 50 about ten thousandths of an inch or slightly higher above the level of the top surface of ground electrode 58; and the height of supply electrodes 42 as approximately the sum of two to eight thousandths of an inch in allowance for P, approximately twelve to eighteen thousandths of an inch in allowance for a touch threshold of five to fifteen ounces, a height of eight to ten thousandths of an inch in allowance for the height of input electrode 50 above reference electrode 58, and an allowance of about one thousandth of an inch in allowance for the height of reference electrode 58.

As has been indicated above, certain situations exist where it may be tolerable to allow reference electrode 58 to be touched simultaneously with the bridging of operative electrodes 42 and 50. The basic situation envisioned at the present time is where manufacturing costs are significantly reduced by the simultaneous application of electrodes 42, 50, and 58, all of the same height. If the above set out factors are present, it may be advantageous to allow touching of the reference electrode 58. It is to be noticed that the occlusion effect referred to above can yet be avoided by use of an array of the open ended, open type shown in FIGS. 1 and 2, or the like. The basic situation which touching of the reference electrode 58 can be tolerated is where the voltage applied to supply electrode 42 has a sufficient value to reliably actuate the D.C. amplifier to which input electrode 50 is to be connected in the event that reference electrode 58 is touched upon the bridging of supply and input electrodes 42 and 50.

Situations also exist in which it is also tolerable that input electrode 50 be contacted by the finger of an operator before supply electrode 42 can harmlessly ground or reference the voltage in an operator's body, i.e., the usual alternating voltage induced from an external source into the operator's body or the static electricity existing in the operator's body. Examples of such situations in which an A.C. modulation of the switch can be tolerated are situations in which switch actuation is desired to be sufficiently show that it is poossible to filter such A.C. modulation within the D.C. amplifier to which switch 30 is to be connected. A further situation is one in which switch 30 is desired to ultimately provide actuation of a latching relay. In this case, once the relay is latched, further modulation provided by the A.C. voltage in an operator's body may have no effect. A further case is where other type of latching is provided wherein the modulation may also have no effect. Examples of situations in which the static electricity discharge can be tolerated is where the input to amplifier 74 is protected as by a voltage breakdown element between input 72 and ground 86 to thus shield the input from the effects of the static electricity.

In FIGS. 20 and 21, the use of an LED allows a lighted switch. That is, the LED is actuated upon the actuation of switch 30 or the circuit to which it is connected to thereby provide light upon such actuation. Since switch 30 has no moving parts to in any way indicate to an operator when an actuation has occurred, it is deemed preferable under some circumstances for human engineering reasons to provide some indication to an operator as to when a switch or circuit actuation has occurred. The light from LED 180 provides such an indication.

Thus, a touch sensitive electronic switch which has no moving parts and is actuated by the skin resistance of an operator bridging switch electrodes and lowering the D.C. resistance across the face of the switch has been provided. As described, the electronic switch may be used to control D.C. circuits in place of a conventional switch. The electronic switch may also be used to control A.C. circuits through the use of a bidirectional output element such as an M.O.S. semiconductor.

Now that the basic teachings of the present invention have been explained, many extensions and variations will be obvious to one having ordinary skill in the art. Thus, since the invention disclosed herein may be embodied in other specific forms without departing from the spirit or general characteristics thereof, some of which forms have been indicated, the embodiments described herein are to be considered in all respects illustrative and not restrictive. The scope of the invention is indicated by the appended claims, rather than by the foregoing description, and all changes which come within the meaning and range of equivalency of the claims are intended to be embraced therein.

What is claimed is:

1. Electronic switch apparatus operable by the lateral bridging of switch electrodes by the skin resistance of an operator's finger, comprising in combination: a planar insulator having top and bottom surfaces and at least three edges; a digitated array of first electrodes arranged to be connected to the input of a D.C. amplifier, with the input electrodes laterally immovably attached to the top surface of the insulator and rising from the top surface of the insulator to expose a top surface of the input electrodes to the finger of an operator; first electrical means for providing an electrical connection between the input electrodes and an input to a D.C. amplifier; a digitated array of second electrodes arranged to be connected to the voltage supply of the D.C. amplifier, with the supply electrodes laterally immovably attached to the top surface of the insulator and rising from the top surface of the insulator to expose a top surface of the supply electrodes to the finger of an operator; the digitated array of supply electrodes being laterally spaced and insulated from the array of input electrodes and interdigitated with the array of input electrodes; second electrical means for providing an electrical connection between the supply electrodes and the voltage supply within the D.C. amplifier; an array of third electrodes arranged to be connected to a reference within the D.C. amplifier, with the reference electrodes laterally immovably attached to the top surface of the insulator, laterally spaced and insulated from both the input electrodes and supply electrodes, and positioned laterally between the input electrodes and supply electrodes for interrupting any leakage current attempting to flow between the input electrodes and supply electrodes and conduct such leakage current to the reference; third electrical means for providing an electrical connection between the reference electrodes and the reference within the D.C. amplifier.

2. The electronic switch apparatus of claim 1, wherein: at least a portion of the input electrode is exposed upon a first edge of the insulator; at least a portion of the supply electrode is exposed upon a second edge of the insulator; and at least a portion of the reference electrode is exposed upon a third edge of the insulator to allow ease of connection to the respective electrodes by edge-coating of the insulator.

3. The electronic switch apparatus of claim 1, wherein the relationship between the level of the top surface of the array of input electrodes and the level of the top surface of the array of supply electrodes and the lateral spacing between the array of input electrodes and the array of supply electrodes is that P is at least equal to R minus the square root of the quantity $(R^2-Y^2)$ where P represents the height differential between the level of the top surface of the array of input electrodes and the level of the top surface of the array of supply electrodes, Y represents the lateral spacing between the array of input electrodes and the array of supply electrodes, and R represents the curvature of the smallest finger expected to operate the electronic switch apparatus, the relationship insuring that the finger of an operator touches the array of supply electrodes before contact is made between the finger and the array of input electrodes to thereby allow good contact of the operator's finger with the array of supply electrodes before contact is made with the array of input electrodes and thereby allow the harmless grounding of the usual alternating voltage induced from an external source into the operator's body.

4. The electronic switch apparatus of claim 3, wherein the level of the top surface of the array of reference electrodes is below the level of the top surface of the array of input electrodes and the level of the top surface of the array of supply electrodes in a manner to insure the array of reference electrodes is not touched by the operator's finger with the touching of the arrays of input and supply electrodes.

5. The electronic switch apparatus of claim 4, wherein: Y is within the range of fifty thousandths of an inch; the level of the top surface of the array of input electrodes is within the range of fifteen thousandths of an inch above the level of the top surface of the array of reference electrodes; and the level of the top surface of the array of supply electrodes is determined by adding the height P, the height dictated by the touch threshold desired, and the height of the level of the top surface of the array of input electrodes.

6. The electronic switch apparatus of claim 5, wherein: Y equals thirty-five thousandths of an inch; and the level of the top surface of the array of input electrodes is ten thousandths of an inch above the level of the array of reference electrodes.

7. The electronic switch apparatus of claim 6, wherein the electrodes include a conductive paste screened onto the insulator and cured.

8. The electronic switch apparatus of claim 7, wherein: the insulator comprises a ceramic slice; a D.C. amplifier is mounted upon the bottom surface of the ceramic; electrical connection is made between the array of input electrodes and the D.C. amplifier by means of an edge-coated connection between the top surface of the ceramic insulator and the bottom surface of the ceramic insulator; electrical connection is made between the array of supply electrodes and the D.C. amplifier by means of an edge-coated connection between the top surface of the insulator and the bottom surface of the insulator; and electrical connection is made between the array of reference electrodes and the D.C. amplifier by means of an edge-coated connection between the top surface of the insulator and the bottom surface of the insulator.

9. The electronic switch apparatus of claim 8, wherein: the array of input electrodes includes four fingers interconnected by a conductive trace positioned adjacent a first edge of the ceramic; the supply electrode comprises five fingers interdigitated with the four fingers of the input electrode and the five fingers of the supply electrode are connected by a conductive trace positioned adjacent a second edge of the ceramic; and the array of reference electrodes are arranged in a serpentine fashion between the interdigitated fingers comprising the input electrodes and the supply electrodes.

10. The electronic switch apparatus of claim 9, wherein: a further conductor is immovably arranged upon the top surface of the insulator in a corner of the insulator adjacent the supply electrodes, with the further conductor spaced and insulated from each of the input, supply, and reference electrodes; and a light emitting diode is connected between the supply electrode and the further conductor.

11. The electronic switch apparatus of claim 10, wherein: the array of input electrodes, the array of supply electrodes and the array of reference electrodes comprise an open ended, open array.

12. The electronic switch apparatus of claim 1, wherein: a further conductor is immovably arranged upon the top surface of the insulator adjacent the supply electrodes, with the further conductor spaced and insulated from each of the input, supply, and reference electrodes; and a light emitting diode is connected between the supply electrode and the further conductor.

13. The electronic switch apparatus of claim 1, wherein: the array of input electrodes, the array of supply electrodes and the array of reference electrodes comprise an open ended, open array.

14. Electronic switch apparatus operable by the lateral bridging of switch electrodes by the skin resistance of an operator, comprising in cross section: a laterally repetitive arrangement of first electrodes, and second electrodes, and third electrodes, with individual third electrodes arranged between individual first elelctrodes and second electrodes to interrupt any practical, contaminable path for leakage of current between any of the first electrodes and any of the second electrodes, each first electrode, second electrode, and third electrode arranged in a laterally spaced and insulated relationship.

15. The electronic switch apparatus of claim 14 wherein the first electrodes are arranged to be connected to the input of a D.C. amplifier, the second electrodes are arranged to be connected to the voltage supply terminal of a D.C. amplifier, and the third electrodes are arranged to be connected to a reference point within a D.C. amplifier, including: an insulating surface, the electrodes being arranged with respect to the insulating surface to expose at least portions of the input electrodes and supply electrodes to the finger of an operator to allow the lateral bridging of the input electrodes and supply electrodes thereby lowering the D.C. resistance between the input electrodes and the supply electrodes to provide an actuation of the electronic switch apparatus; first electrical means for providing an electrical connection between the input electrodes and the input to the D.C. amplifier; second electrical means for providing an electrical connection between the supply electrodes and the voltage supply of the D.C. amplifier; and third electrical means for providing an electrical connection between the reference electrodes and a reference within the D.C. amplifier.

16. The electronic switch apparatus of claim 15, wherein the dimensioning and spacing of the electrodes is significantly less than the radius of the smallest operator's finger expected to operate the switch apparatus to substantially eliminate the critical nature of the operator's finger as a factor in actuating the electronic switch apparatus, the placement of the operator's finger upon the switch electrodes laterally bridging between the first electrodes and the second electrodes and the current conducted through the resistance of the operator's finger between the first electrodes and the second electrodes causing a lowering of the D.C. resistance between the first electrodes and the second electrodes to thereby provide an actuation of the switch apparatus.

17. The electronic switch apparatus of claim 16, wherein the arrangement of first electrodes, the arrangement of second electrodes, and the arrangement of third electrodes comprise an open array.

18. The electronic switch apparatus of claim 17, wherein the arrangement of first electrodes, the arrangement of second electrodes, and the arrangement of third electrodes comprise an open ended open array.

19. The electronic switch apparatus of claim 14, wherein the dimensioning and spacing of the electrodes is significantly less than the radius of the smallest operator's finger expected to operate the switch apparatus to substantially eliminate the critical nature of the operator's finger as a factor in actuating the electronic apparatus, the placement of the operator's finger upon the switch electrodes laterally bridging between the first electrodes and the second electrodes and the current conducted through the resistance of the operator's finger between the first electrodes and the second electrodes causing a lowering of the D.C. resistance between the first electrodes and the second electrodes to thereby provide an actuation of the switch apparatus.

20. The electronic switch apparatus of claim 19, wherein the arrangement of first electrodes, the arrangement of second electrodes, and the arrangement of third electrodes comprise an open array.

21. The electronic switch apparatus of claim 20, wherein the arrangement of first electrodes, the arrangement of second electrodes, and the arrangement of third electrodes comprise an open ended open array.

22. Electronic switch apparatus operable by the lateral bridging of switch electrodes by the skin resistance of an operator's finger, comprising in combination: an insulating surface; arrays of electrodes arranged upon the surface of an insulator, comprising: an array of first electrodes laterally immovably attached to the insulating surface and rising from the insulating surface to expose a top surface to the finger of an operator; an array of second electrodes laterally immovably attached to the insulating surface, laterally spaced and insulated from the array of first electrodes around and about the components of the array of first electrodes, and rising from the insulating surface to expose a top surface to the finger of an operator; an array of third electrodes laterally immovably attached to the insulating surface, laterally spaced and insulated from both the components of the array of first electrodes and the components of the array of second electrodes, and rising from the insulating surface between the components of the array of first electrodes and the components of the array of second electrodes as a conductive electrical shielding electrode allowing leakage current between the components of the array of first electrodes and the components of the array of second electrodes to be conducted away from the switch apparatus to aid in preventing the flow of leakage current between the array of first electrodes and the array of second electrodes tending to set up a direct current path from the array of first electrodes to the array of second electrodes; the dimensioning and spacing of the electrodes being significantly less than the radius of the smallest operator's finger expected to operate the switch apparatus to substantially eliminate the critical nature of the operator's finger as a factor in actuating the electronic switch apparatus; first electrical means for providing an electrical connection to the array of first electrodes; second electrical means for providing an electrical connection to the array of second electrodes; and third electrical means for providing an electrical connection to the array of third electrodes.

23. Electronic switch apparatus of claim 22 wherein the array of first electrodes comprises an open array, and wherein the array of second electrodes comprises an open array.

24. The electronic switch apparatus of claim 23 wherein the array of first electrodes and the array of second electrodes comprises an interdigitated array.

25. The electronic switch apparatus of claim 24 wherein the array of first electrodes, the array of second electrodes, and the array of third electrodes comprise conductive paste screened into the insulating surface.

26. Electronic switch apparatus of claim 24 wherein the electrodes arrays are arranged upon an insulator having at least three sides, and wherein at least a portion of the array of first electrodes is exposed upon a first side of the insulator, wherein at least a portion of the array of second electrodes is exposed upon a second side of the insulator, and wherein at least a portion of the array of third electrodes is exposed upon a third side of the insulator to allow ease of connection to the respective arrays of electrodes.

27. The electronic switch apparatus of claim 26 wherein: a further conductor is immovably arranged upon the surface of the insulator in a corner of the insulator adjacent the second electrode, with the further conductor spaced and insulated from each of the first, second, and third electrodes; and a light emitting diode is connected between the second electrode and the further conductor.

28. The electronic switch apparatus of claim 26 wherein: the insulator includes a top face and a bottom face; the electrode arrays are attached to the top face of the insulator; a D.C. amplifier is mounted upon the bottom face of the insulator; electrical connection is made between the first electrode and the D.C. amplifier by means of an edge-coated connection between the top face of the insulator and the bottom face of the insulator; electrical connection is made between the array of second electrodes and the D.C. amplifier by means of an edge-coated connection between the top face of the insulator and the bottom face of the insulator; and electrical connection is made between the array of third electrodes and the D.C. amplifier by means of an edge-coated connection between the top face of the insulator and the bottom face of the insulator.

29. The electronic switch apparatus of claim 28 wherein the level of the top surface of the array of second electrodes is arranged above the level of the top surface of the array of first electrodes in a manner that the finger of an operator touches a second electrode before contact is made between the finger and a first electrode to thereby allow good contact of the operator's finger with the array of second electrodes before contact is made with the array of first electrodes and thereby allow the harmless grounding of voltage in the operator's body and allow a direct durrent path to be set up laterally between the array of first electrodes and the array of second electrodes as soon as the finger of the operator touches a first electrode.

30. The electronic switch apparatus of claim 29 wherein the relationship between the level of the top surface of the array of first electrodes and the level of the top surface of the array of second electrodes and the lateral spacing between the array of first electrodes and the array of second electrodes is that P is at least equal to R minus the square root of the quantity ($R^2 - Y^2$), where P represents the height differential between the level of the top surface of the array of first electrodes and the level of the top surface of the array of second electrodes, Y represents the lateral spacing between the array of first electrodes and the array of second electrodes, and R represents the curvature of the smallest finger expected to operate the electronic switch apparatus.

31. The electronic switch apparatus of claim 30 wherein the level of the top surface of the array of third electrodes is arranged below the level of the top surface of the array of first electrodes to avoid contact with the finger of an operator touching the array of first electrodes and the array of second electrodes.

32. The electronic switch apparatus of claim 31 wherein the level of the top surface of the array of third electrodes is arranged below the level of the top surface of the array of first electrodes by a distance sufficient to exceed the maximum compressibility limits of the finger of the operator to insure that the array of third electrodes is not touched by the operator's finger with the touching of the arrays of first and second electrodes.

33. The electronic switch apparatus of claim 31 wherein: Y is within the range of fifty thousandths of an inch; the level of the top surface of the array of first electrodes is within the range of fifteen thousandths of an inch above the level of the top surface of the array of third electrodes; and the level of the top surface of the array of second electrodes is determined by adding the height P, the height dictated by the touch threshold desired, and the height of the level of the top surface of the array of first electrodes.

34. The electronic switch apparatus of claim 33 wherein: Y equals thirty five thousandths of an inch; and the level of the top surface of the array of first electrodes is substantially ten thousandths of an inch above the level of the array of third electrodes.

35. The electronic switch apparatus of claim 34 wherein: the insulating media is a ceramic slice; the third electrode is a conductive paste uniformly screened onto the ceramic to a height of substantially one thousandth of an inch.

36. The electronic switch apparatus of claim 35, wherein: a further section of conductive paste is uniformly screened onto the ceramic in a corner of the ceramic adjacent the second electrode, with the further conductive section spaced and insulated from each of the first, second, and third electrodes; and a light emitting diode is connected between the second electrode and the further conductive section.

37. The electronic switch apparatus of claim 22, wherein the level of the top surface of the array of second electrodes is arranged above the level of the top surface of the array of first electrodes in a manner that the finger of an operator touches a second electrode before contact is made between the finger and a first electrode to thereby allow good contact of the operator's finger with the array of second electrodes before contact is made with the array of first electrodes and thereby allow the harmless grounding of the voltage in the operator's body and allow a direct current path to be set up laterally between the array of first electrodes and the array of second electrodes as soon as the finger of the operator touches a first electrode.

38. The electronic switch apparatus of claim 37, wherein the relationship between the level of the top surface of the array of first electrodes and the level of the top surface of the array of second electrodes and the lateral spacing between the array of first electrodes and the array of second electrodes is that P is at least equal to R minus the square root of the quantity ($R^2 - Y^2$), where P represents the height differential between the level of the top surface of the array of first electrodes and the level of the top surface of the array of second electrodes, Y represents the lateral spacing between the array of first electrodes and the array of second electrodes, and R represents the curvature of the smallest finger expected to operate the electronic switch apparatus.

39. The electronic switch apparatus of claim 38 wherein the level of the top surface of the array of third electrodes is arranged below the level of the top surface of the array of first electrodes to avoid contact with the finger of an operator touching the array of first electrodes and the array of second electrodes.

40. The electronic switch apparatus of claim 39 wherein the level of the top surface of the array of third electrodes is arranged below the level of the top surface of the array of first electrodes by a distance sufficient to exceed the maximum compressibility limits of the finger of the operator to insure that the array of third electrodes is not touched by the operator's finger with the touching of the arrays of first and second electrodes.

41. The electronic switch apparatus of claim 39 wherein: Y is within the range of fifty thousandths of an inch; the level of the top surface of the array of first electrodes is within the range of fifteen thousandths of an inch above the level of the top surface of the array of third electrodes; and the level of the top surface of the array of second electrodes is determined by adding the height P, the height dictated by the touch threshold desired, and the height of the level of the top surface of the array of first electrodes.

42. The electronic switch apparatus of claim 41 wherein: Y equals thirty five thousandths of an inch; and the level of the top surface of the array of first electrodes is substantially ten thousandths of an inch above the level of the array of third electrodes.

43. The electronic switch apparatus of claim 42, wherein: the insulating media is a ceramic slice; the third electrode is a conductive paste uniformly screened onto the ceramic to a height of substantially one thousandths of an inch.

44. Electronic switch apparatus of claim 22 wherein the electrode arrays are arranged upon an insulator having at least three sides, and wherein at least a portion of the array of first electrodes is exposed upon a first side of the insulator, wherein at least a portion of the array of second electrodes is exposed upon a second side of the insulator, and wherein at least a portion of the array of third electrodes is exposed upon a third side of the insulator to allow ease of connection to the respective arrays of electrodes.

45. The electronic switch apparatus of claim 44 wherein: the insulator includes a top face and a bottom face; the electrode arrays are attached to the top face of the insulator; a D.C. amplifier is mounted upon the bottom face of the insulator; electrical connection is made between the first electrode and the D.C. amplifier by means of an edge-coated connection between the top face of the insulator and the bottom face of the insulator; electrical connection is made between the array of second electrodes and the D.C. amplifier by means of an edge-coated connection between the top face of the insulator and the bottom face of the insulator; and electrical connection is made between the array of third electrodes and the D.C. amplifier by means of an edge-coated connection between the top face of the insulator and the bottom face of the insulator.

46. The electronic switch apparatus of claim 22 wherein the level of the top surface of the array of third electrodes is arranged below the level of the top surface of the array of first electrodes to avoid contact with the finger of an operator touching the array of first electrodes and the array of second electrodes.

47. The electronic switch apparatus of claim 46 wherein the level of the top surface of the array of third electrodes is arranged below the level of the top surface of the array of first electrodes by a distance sufficient to exceed the maximum compressibility limits of the finger of the operator to insure that the array of third electrodes is not touched by the operator's finger with the touching of the arrays of first and second electrodes.

48. The electronic switch apparatus of claim 22 wherein the array of first electrodes, the array of second electrodes, and the array of third electrodes comprise conductive paste screened onto the insulating surface.

49. The electronic switch apparatus of claim 22, wherein: a further conductor is immovably arranged upon the surface of the insulator in a corner of the insulator adjacent the second electrode, with the further conductor spaced and insulated from each of the first, second, and third electrodes; and a light emitting diode is connected between the second electrode and the further conductor.

50. The electronic switch apparatus of claim 22, comprising a closed repetitive array of electrodes.

51. The electronic switch apparatus of claim 50, comprising a clustered closed repetitive array of electrodes.

52. The electronic switch apparatus of claim 22, comprising a clustered open repetitive array of electrodes.

53. The electronic switch apparatus of claim 22, comprising an open-ended open array of electrodes.

54. The electronic switch apparatus of claim 53, comprising a clustered open-ended open array of electrodes.

55. In a touch actuated electronic switch including microelectronic circuitry and including a portion, arranged to be touched by the finger of an operator, coupled to an input conductor to the microelectronic circuitry, an improved touch actuated electronic switch comprising in combination: an insulator having opposed major faces including a first face and a second face spaced from the first face by the thickness of the insulator; a material at least partially conductive of electricity comprising the touch surface with the material disposed upon the first face of the insulator; and material defining the microelectronic circuitry disposed upon the second face of the insulator, with the microelectronic circuitry including at least a portion of the input conductor, including at least one electronic amplifier, and including the remaining electronics necessary for the operation of the touch actuated switch.

56. The touch actuated electronic switch of claim 55 wherein the microelectronics is in the form of hybrid circuitry deposited upon the second face of the insulator.

57. The touch actuated electronic switch of claim 56, wherein at least a portion of the microelectronics is in the form of conductive areas screened onto the second face of the insulator.

58. The touch actuated electronic switch of claim 57 wherein the coupling between the touch surface and the input to the microelectronic circuitry comprises a connection around an edge of the insulator.

59. The touch actuated electronic switch of claim 57 wherein the touch surface is a coating affixed to the first face of the insulator.

60. The touch actuated electronic switch of claim 59 wherein the touch surface is in the form of patterned screening of material.

61. The touch actuated electronic switch of claim 60 wherein the coupling between the touch surface and the input to the microelectronic circuitry comprises a connection around an edge of the insulator.

62. The touch actuated electronic switch of claim 55 wherein the touch surface is a coating affixed to the first face of the insulator.

63. The touch actuated electronic switch of claim 61 wherein the touch surface is in the form of patterned screening of material.

64. The touch actuated electronic switch of claim 63 wherein the coupling between the touch surface and the input to the microelectronic circuitry comprises a connection around an edge of the insulator.

65. The touch actuated electronic switch of claim 55 wherein the coupling between the touch surface and the input to the microelectronic circuitry comprises a connection around an edge of the insulator.

66. The touch actuated electronic switch of claim 55, wherein at least a portion of the microelectronics is in the form of conductive areas screened onto the second face of the insulator.

* * * * *